(12) United States Patent
Yoshida

(10) Patent No.: US 10,580,821 B2
(45) Date of Patent: Mar. 3, 2020

(54) LIGHT-RECEIVING ELEMENT, MANUFACTURING METHOD OF THE SAME, IMAGING DEVICE, AND ELECTRONIC APPARATUS

(71) Applicant: SONY CORPORATION, Tokyo (JP)

(72) Inventor: Shinichi Yoshida, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/064,594

(22) PCT Filed: Dec. 27, 2016

(86) PCT No.: PCT/JP2016/088923
§ 371 (c)(1),
(2) Date: Jun. 21, 2018

(87) PCT Pub. No.: WO2017/122537
PCT Pub. Date: Jul. 20, 2017

(65) Prior Publication Data
US 2019/0027528 A1      Jan. 24, 2019

(30) Foreign Application Priority Data

Jan. 13, 2016  (JP) .................................. 2016-004158
Nov. 11, 2016  (JP) .................................. 2016-220779

(51) Int. Cl.
*H01L 27/146*     (2006.01)
*H01L 31/0224*    (2006.01)
(Continued)

(52) U.S. Cl.
CPC .... *H01L 27/14649* (2013.01); *H01L 31/0224* (2013.01); *H01L 31/03046* (2013.01); *H01L 31/1844* (2013.01); *H01L 31/1868* (2013.01)

(58) Field of Classification Search
CPC ........... H01L 27/14649; H01L 27/1446; H01L 27/14627; H01L 27/14694; H01L 31/0224;
(Continued)

(56) References Cited

U.S. PATENT DOCUMENTS

2010/0044677 A1  2/2010  Nagai
2010/0102368 A1  4/2010  Matsushima et al.
(Continued)

FOREIGN PATENT DOCUMENTS

CN     102623463 A    8/2012
EP        2124256 A1   11/2009
(Continued)

OTHER PUBLICATIONS

International Search Report and Written Opinion of PCT Application No. PCT/JP2016/088923, dated Apr. 4, 2017, 11 pages of ISRWO.

*Primary Examiner* — Kyoung Lee
(74) *Attorney, Agent, or Firm* — Chip Law Group

(57) ABSTRACT

This light-receiving element includes a plurality of photoelectric conversion layers, each of which includes a compound semiconductor, and absorbs a wavelength in an infrared region to generate an electric charge, and an insulating film that is provided to surround each of the plurality of photoelectric conversion layers.

19 Claims, 22 Drawing Sheets

(51) Int. Cl.
*H01L 31/0304* (2006.01)
*H01L 31/18* (2006.01)

(58) Field of Classification Search
CPC ........... H01L 31/03046; H01L 31/1844; H01L 31/1868; H04N 5/33; H04N 5/369
See application file for complete search history.

(56) References Cited

U.S. PATENT DOCUMENTS

| | | |
|---|---|---|
| 2012/0188397 A1 | 7/2012 | Ohta |
| 2013/0095594 A1 | 4/2013 | Matsushima et al. |
| 2015/0097157 A1* | 4/2015 | Onakado ........... H01L 27/14649 257/21 |
| 2015/0228685 A1* | 8/2015 | Uchida ........... H01L 31/022466 257/432 |
| 2016/0269668 A1 | 9/2016 | Oshiyama et al. |

FOREIGN PATENT DOCUMENTS

| | | |
|---|---|---|
| JP | 07-058309 A | 3/1995 |
| JP | 2010-050417 A | 3/2010 |
| JP | 2011-014898 A | 1/2011 |
| JP | 2012-156310 A | 8/2012 |
| JP | 2014-127499 A | 7/2014 |
| JP | 2015-149422 A | 8/2015 |
| KR | 10-2012-0099336 A | 9/2012 |
| TW | 201234571 A | 8/2012 |
| TW | 201523854 A | 6/2015 |
| WO | 2008/093834 A1 | 8/2008 |
| WO | 2015/079944 A1 | 6/2015 |

* cited by examiner

[FIG. 1]
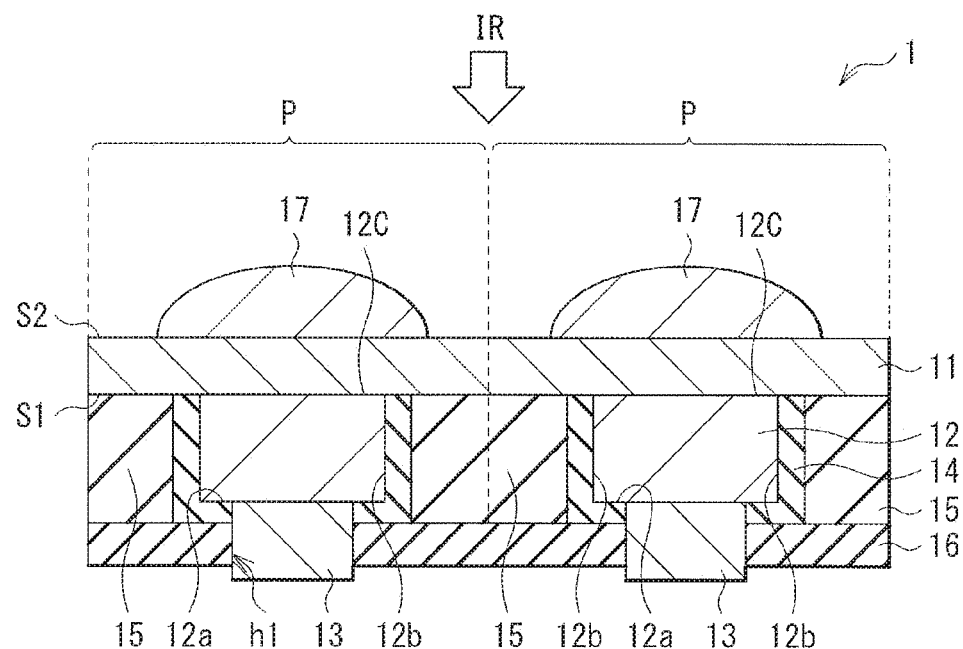
[FIG. 2]
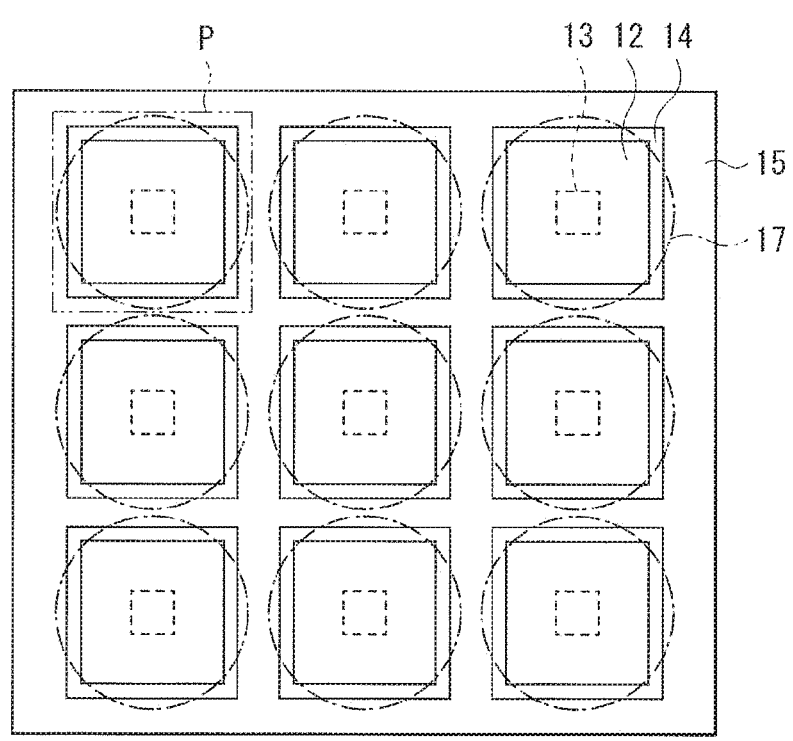

[FIG. 3A]
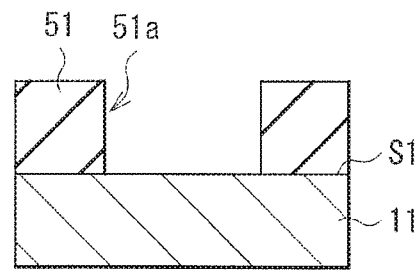
[FIG. 3B]
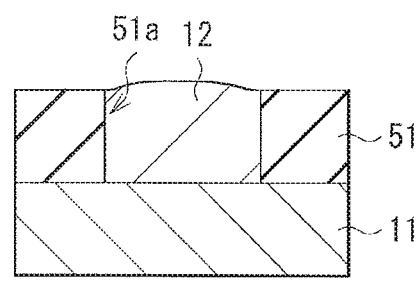
[FIG. 3C]
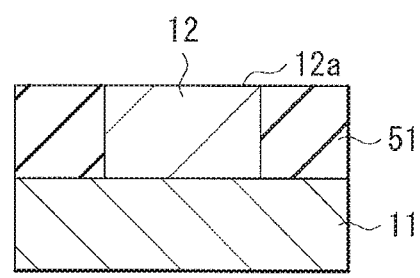
[FIG. 3D]
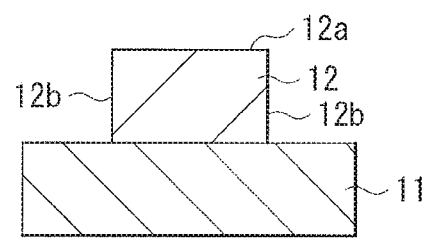

[FIG. 4]
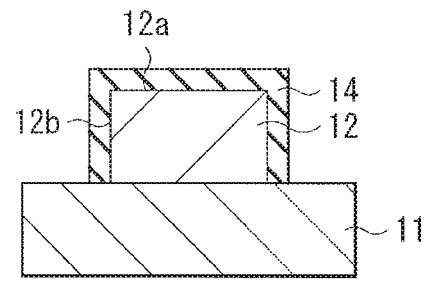
[FIG. 5]
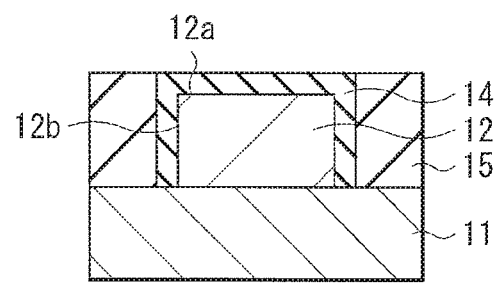
[FIG. 6]
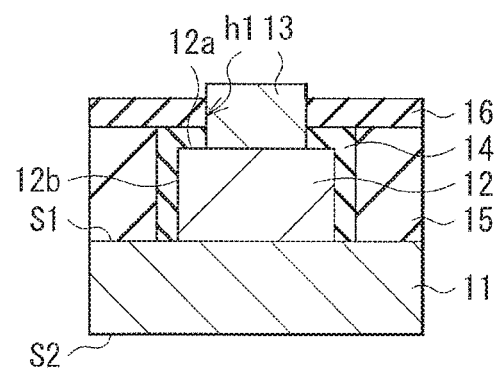

[ FIG. 7 ]
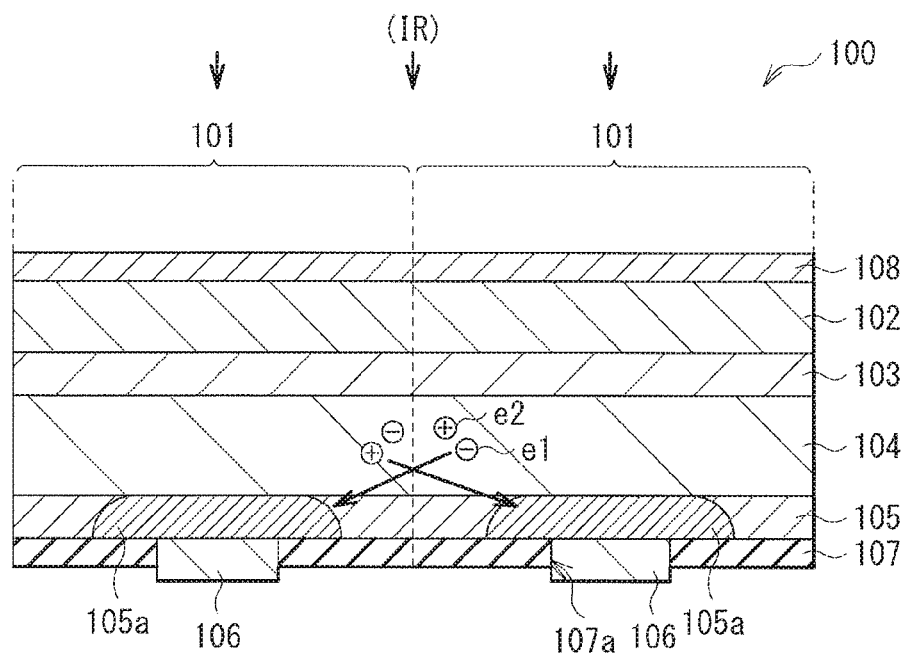
[ FIG. 8 ]
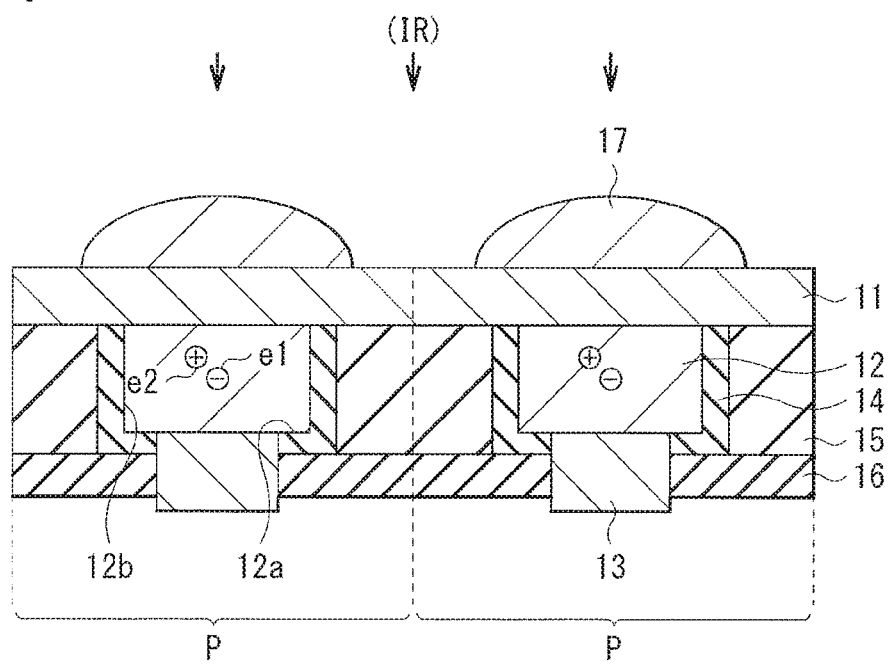

[FIG. 9]
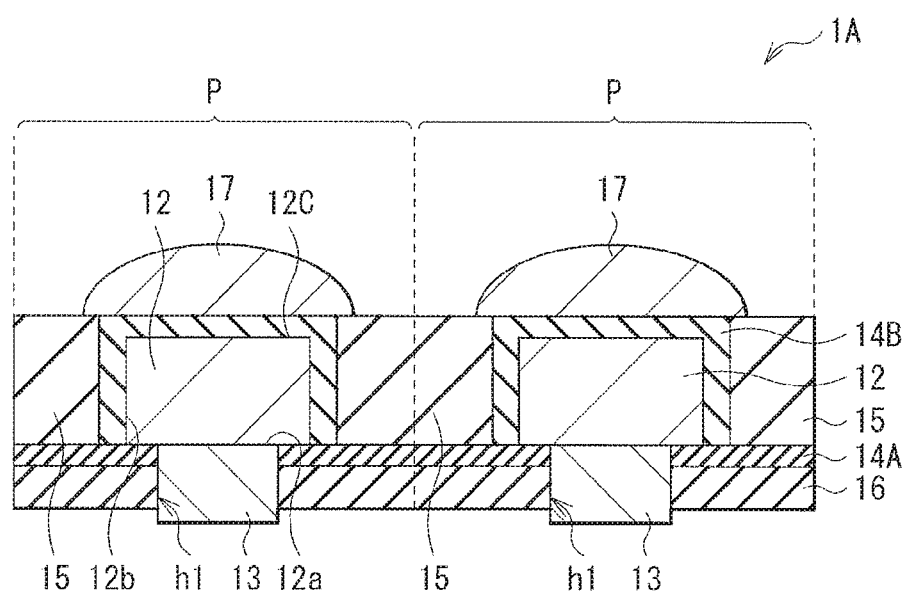

[ FIG. 10A ]
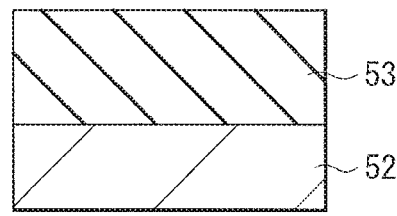
[ FIG. 10B ]
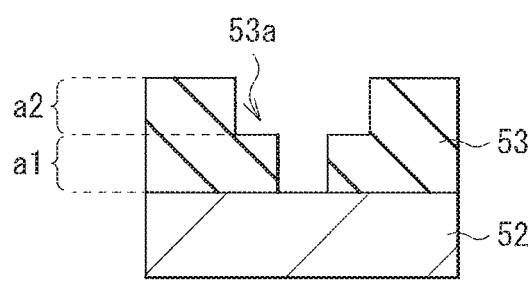
[ FIG. 10C ]
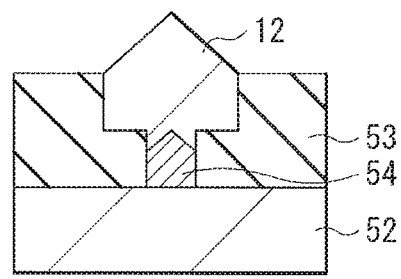
[ FIG. 10D ]
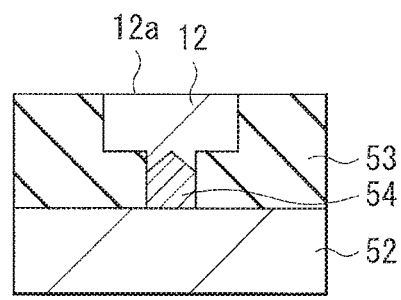

[ FIG. 11 ]
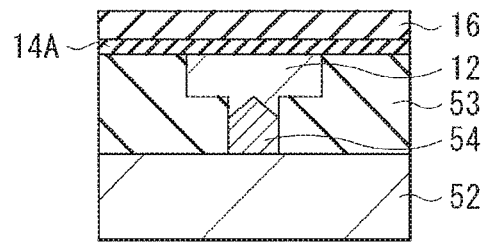
[ FIG. 12 ]
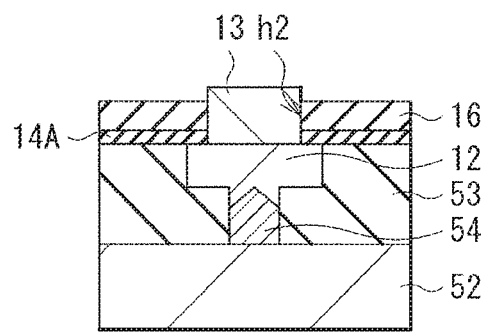
[ FIG. 13A ]
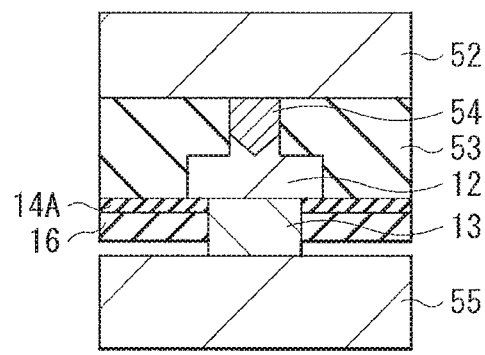

[ FIG. 13B ]
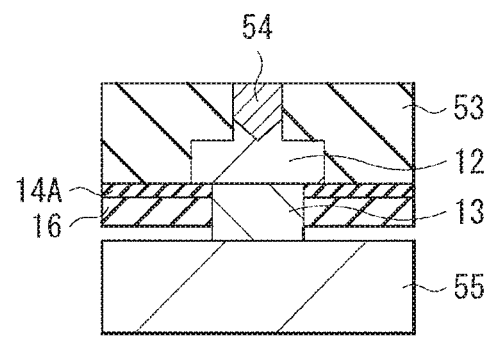
[ FIG. 13C ]
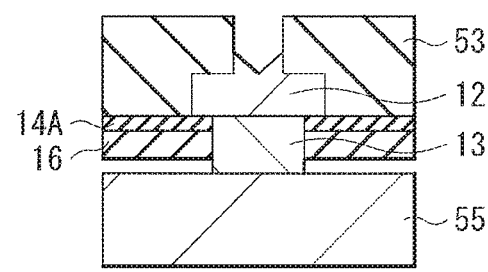
[ FIG. 13D ]
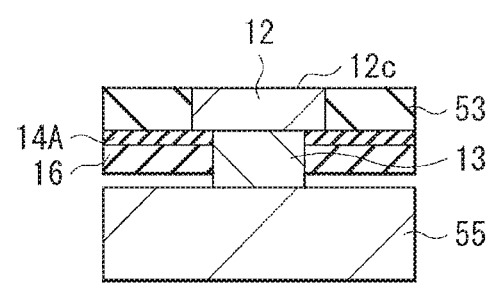
[ FIG. 13E ]
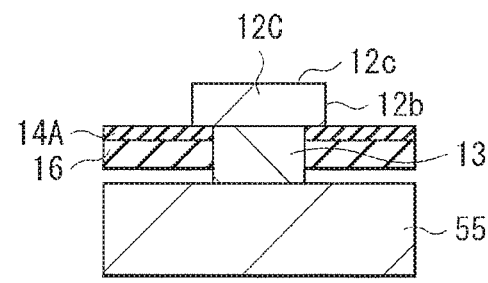

[ FIG. 14 ]
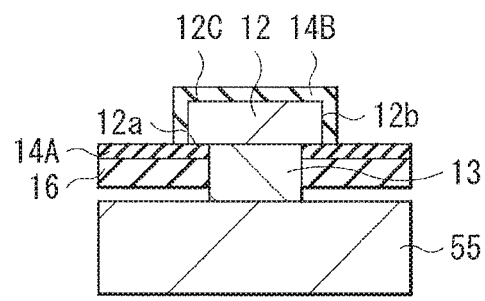
[ FIG. 15 ]
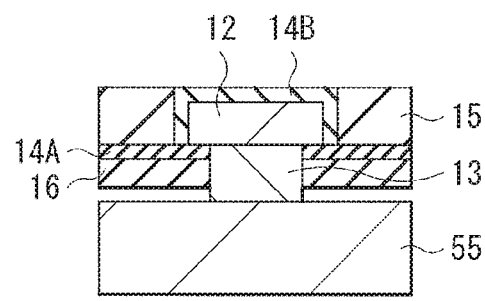

[ FIG. 16 ]
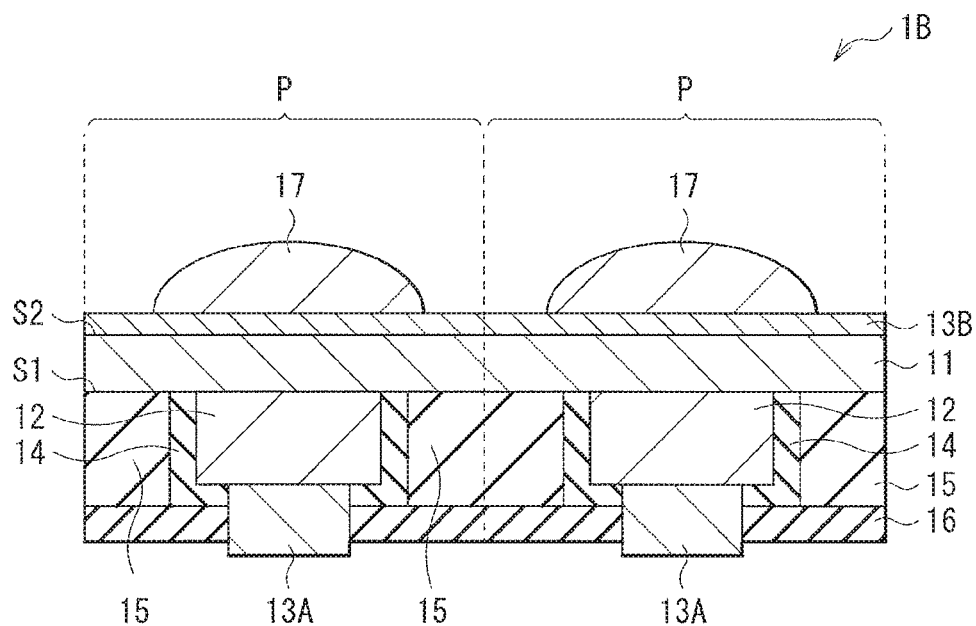
[ FIG. 17 ]
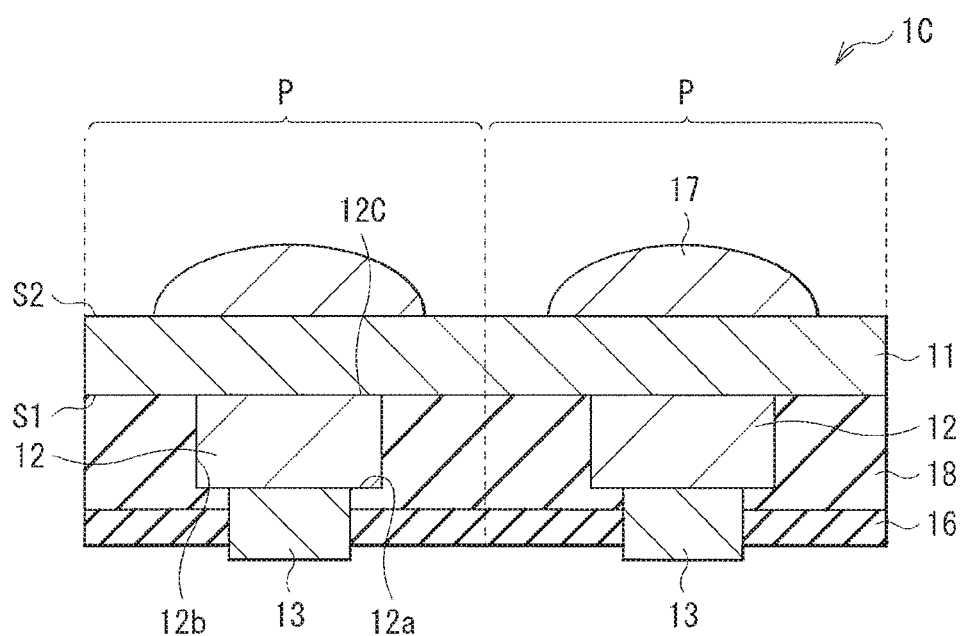

[ FIG. 18 ]
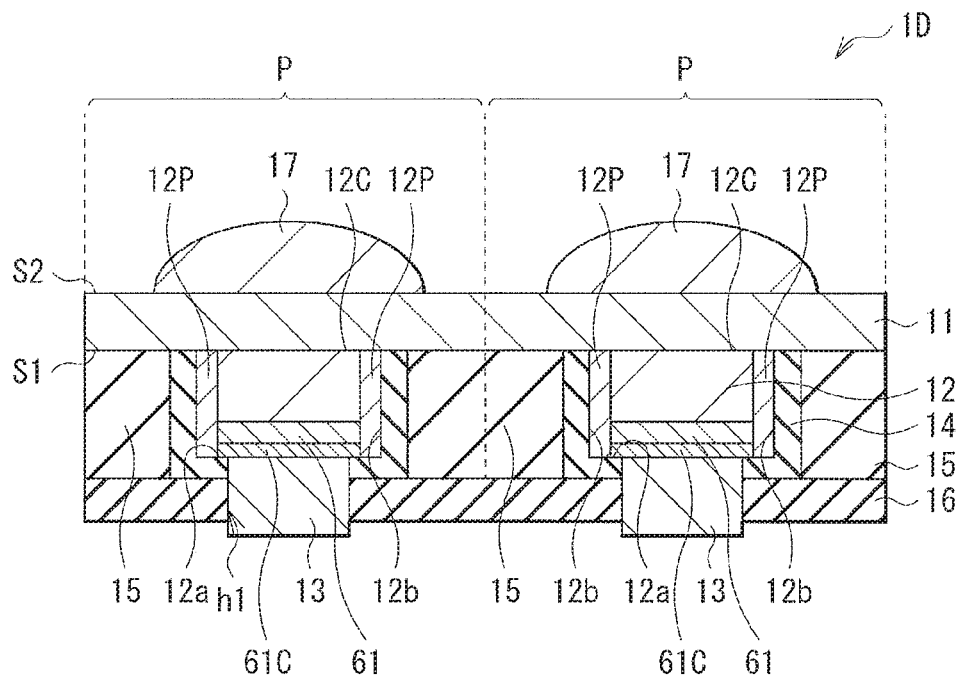
[ FIG. 19 ]
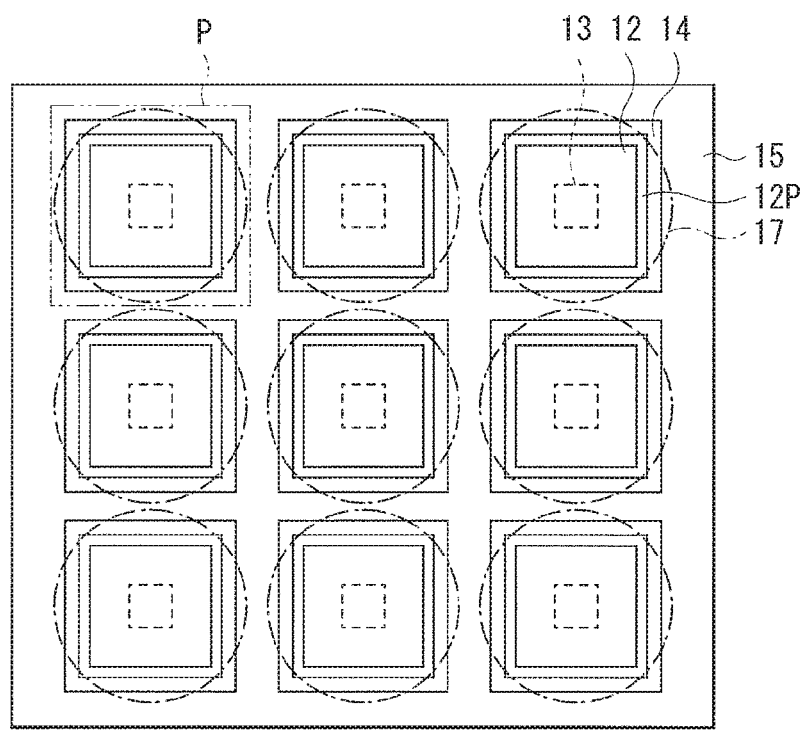

[FIG. 20A]
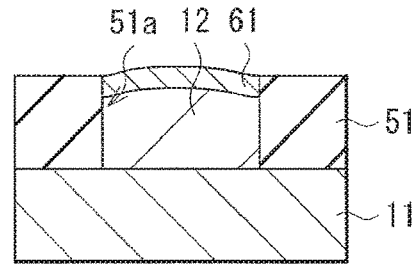
[FIG. 20B]
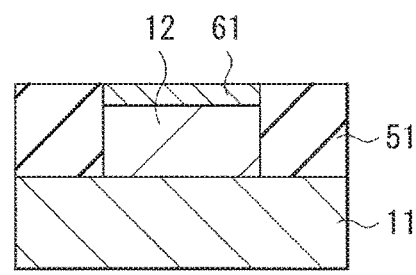
[FIG. 20C]
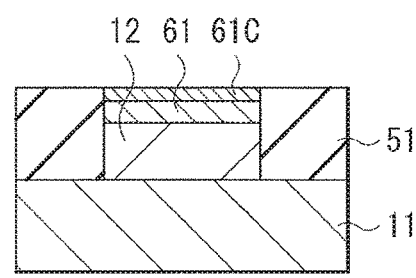
[FIG. 20D]
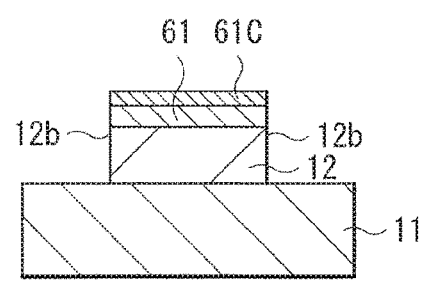
[FIG. 20E]
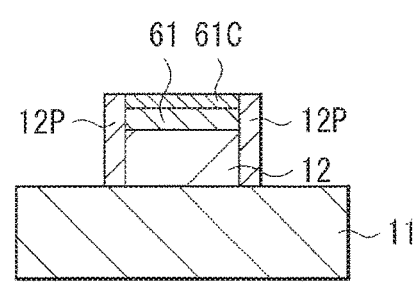

[ FIG. 21A ]
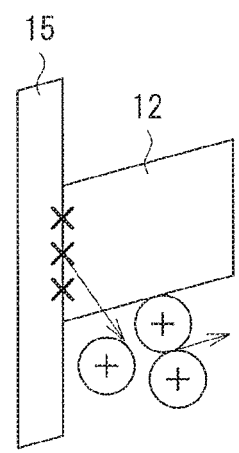
[ FIG. 21B ]
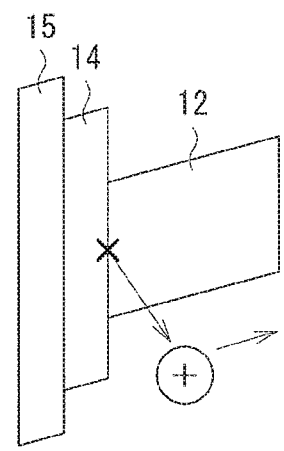

[ FIG. 22A ]
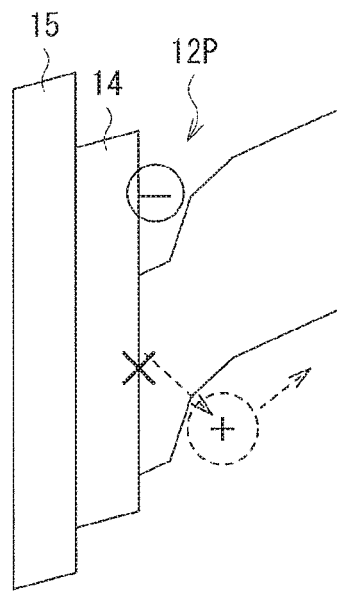
[ FIG. 22B ]
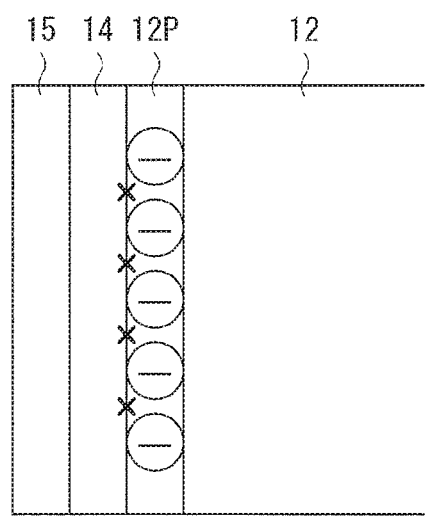

[FIG. 23]
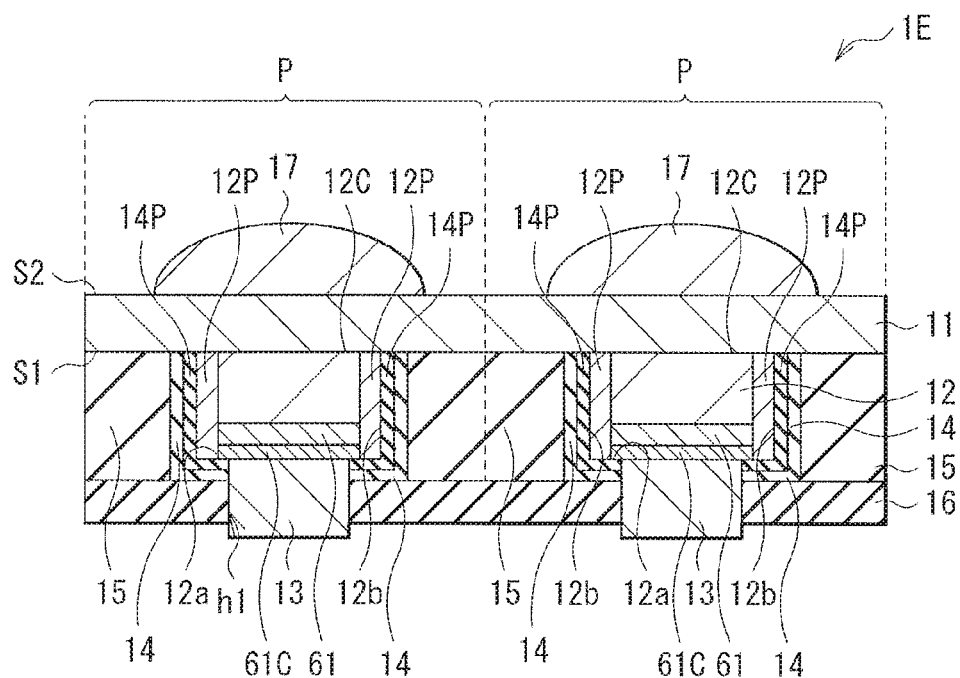
[FIG. 24]
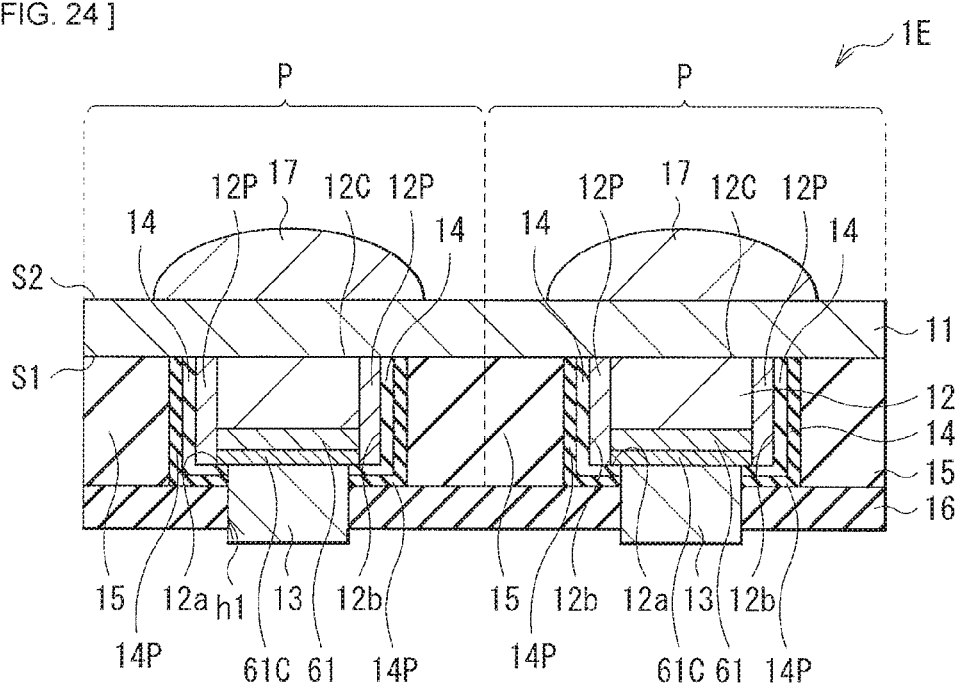

[ FIG. 25 ]
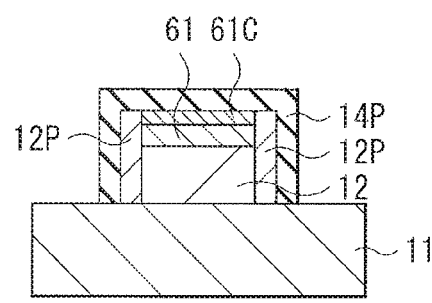
[ FIG. 26 ]
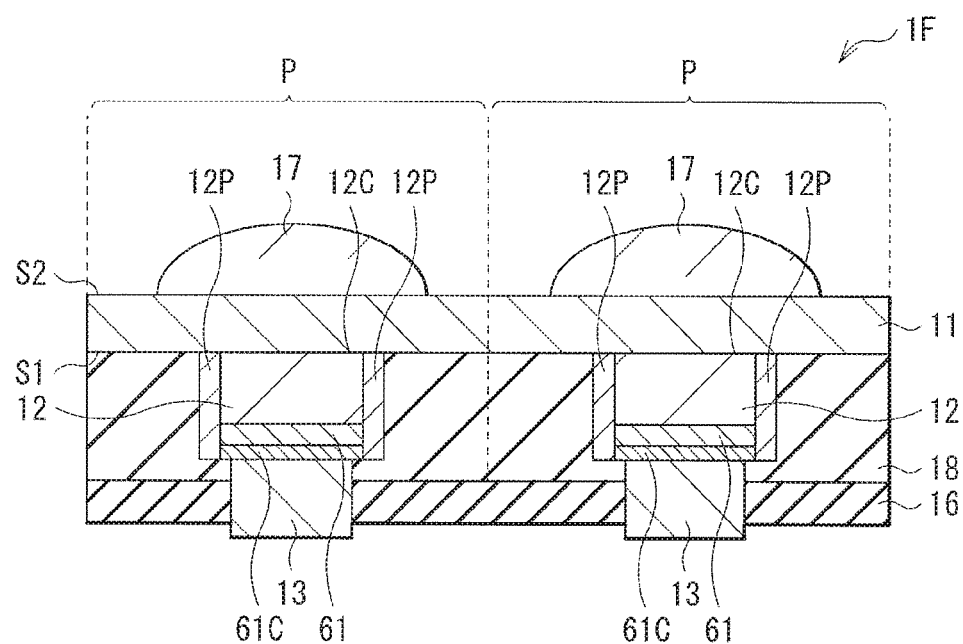

[ FIG. 27 ]
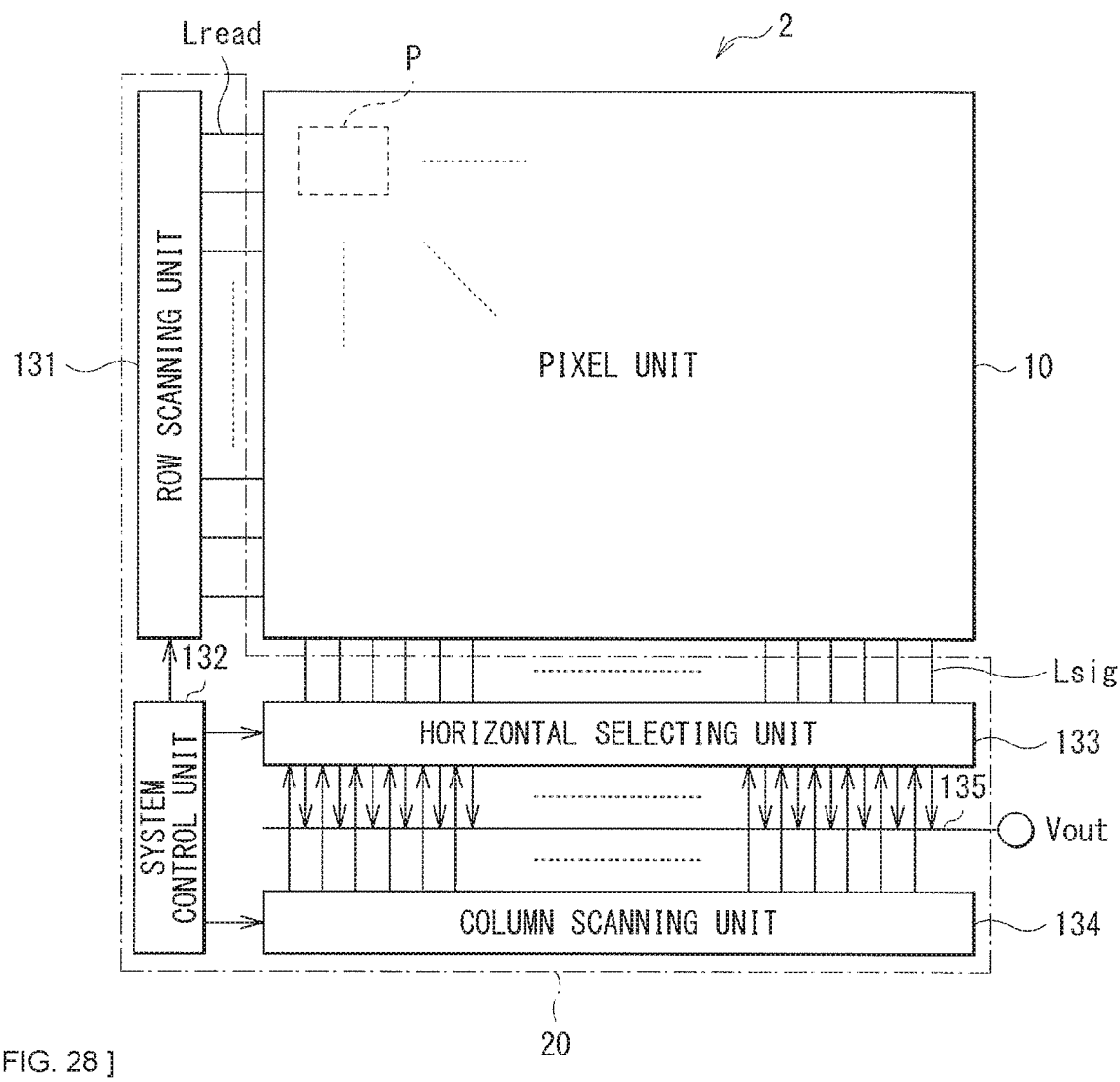
[ FIG. 28 ]
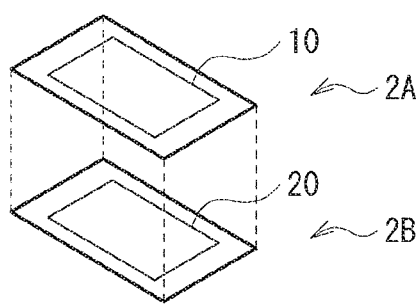

[FIG. 29]
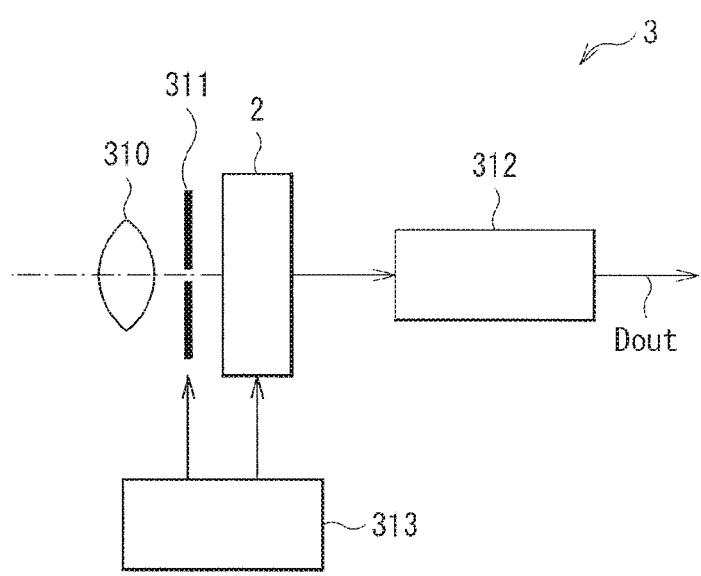

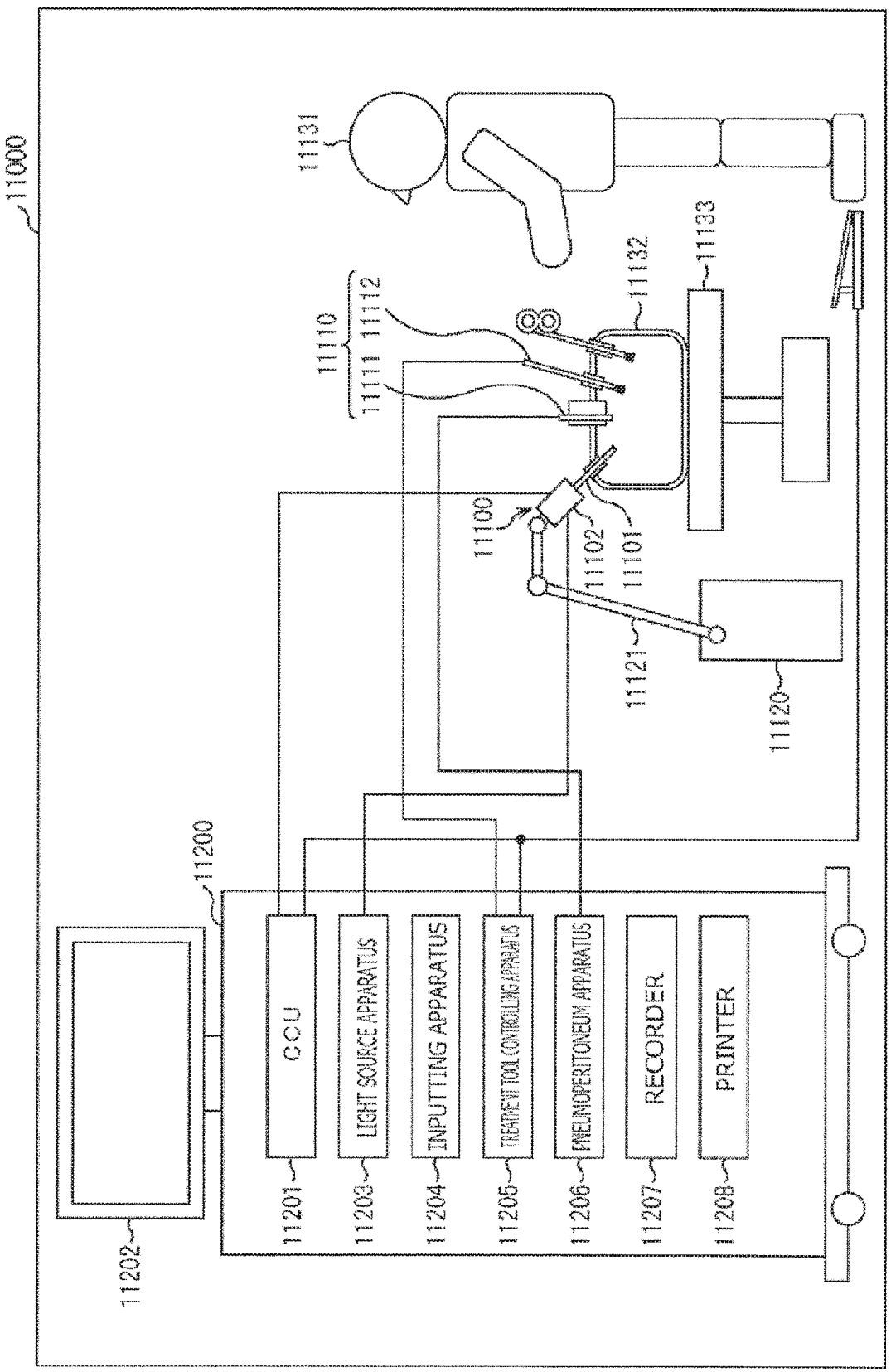

[FIG. 31]
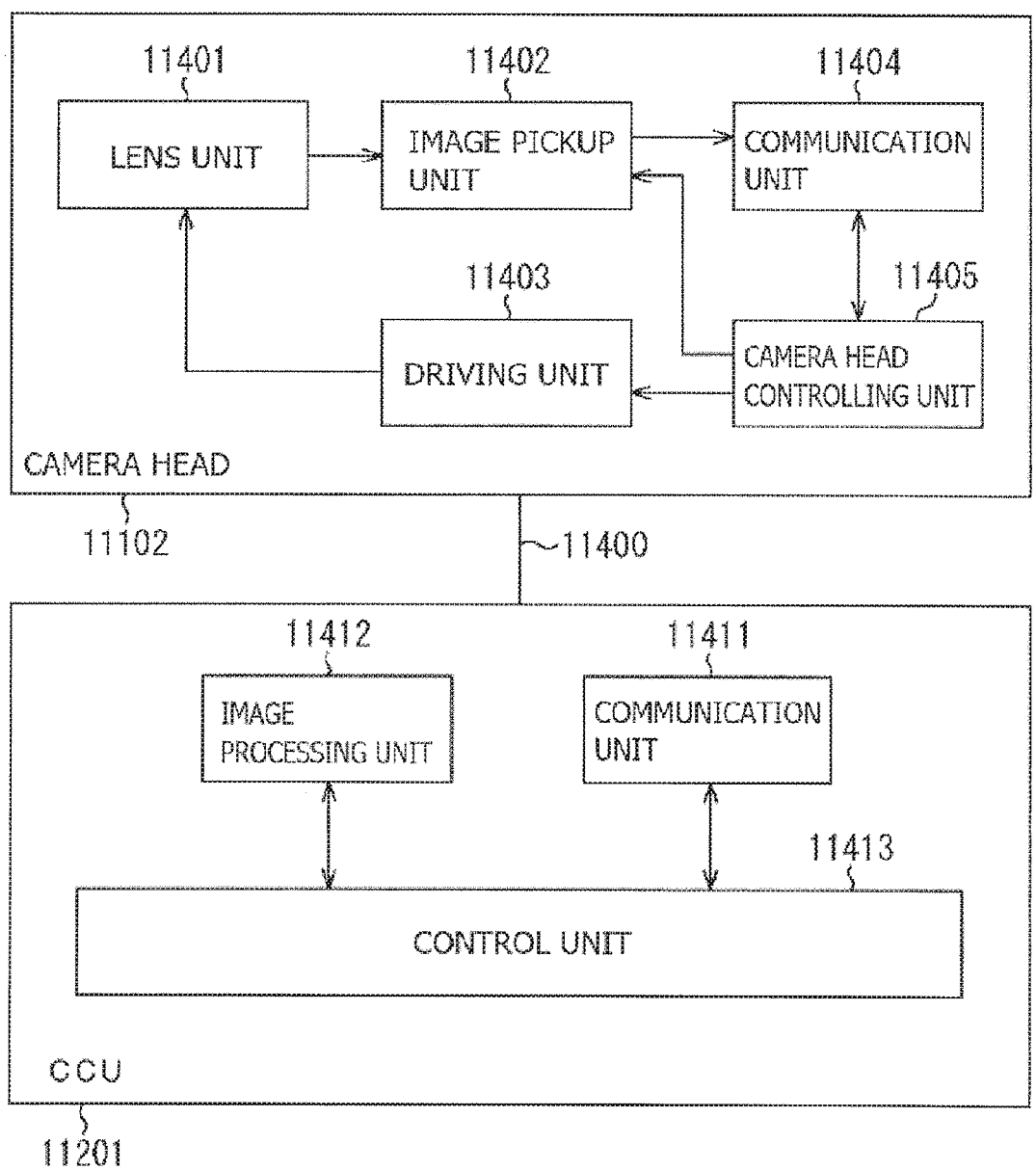

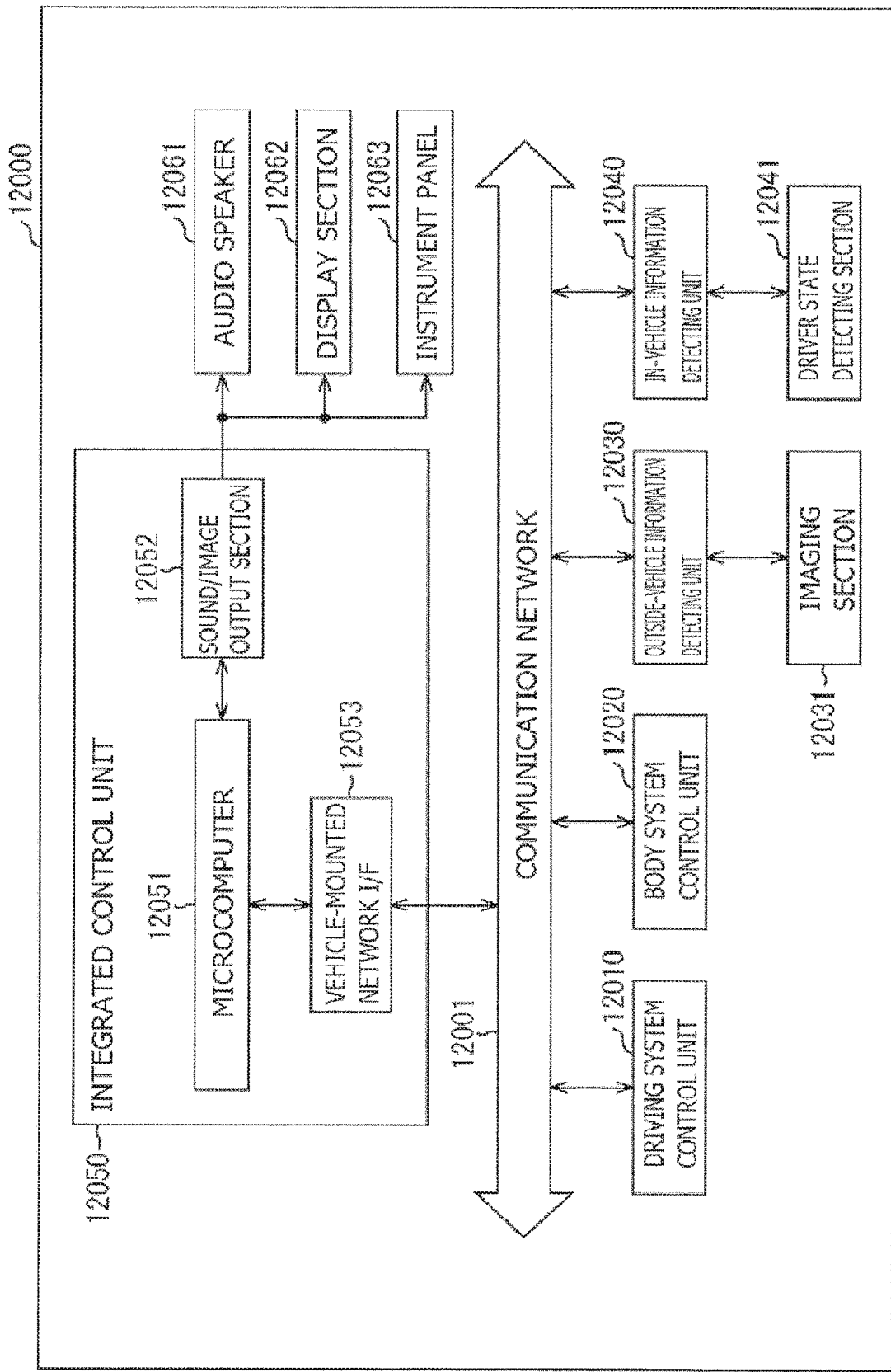
[FIG. 32]

[FIG. 33]
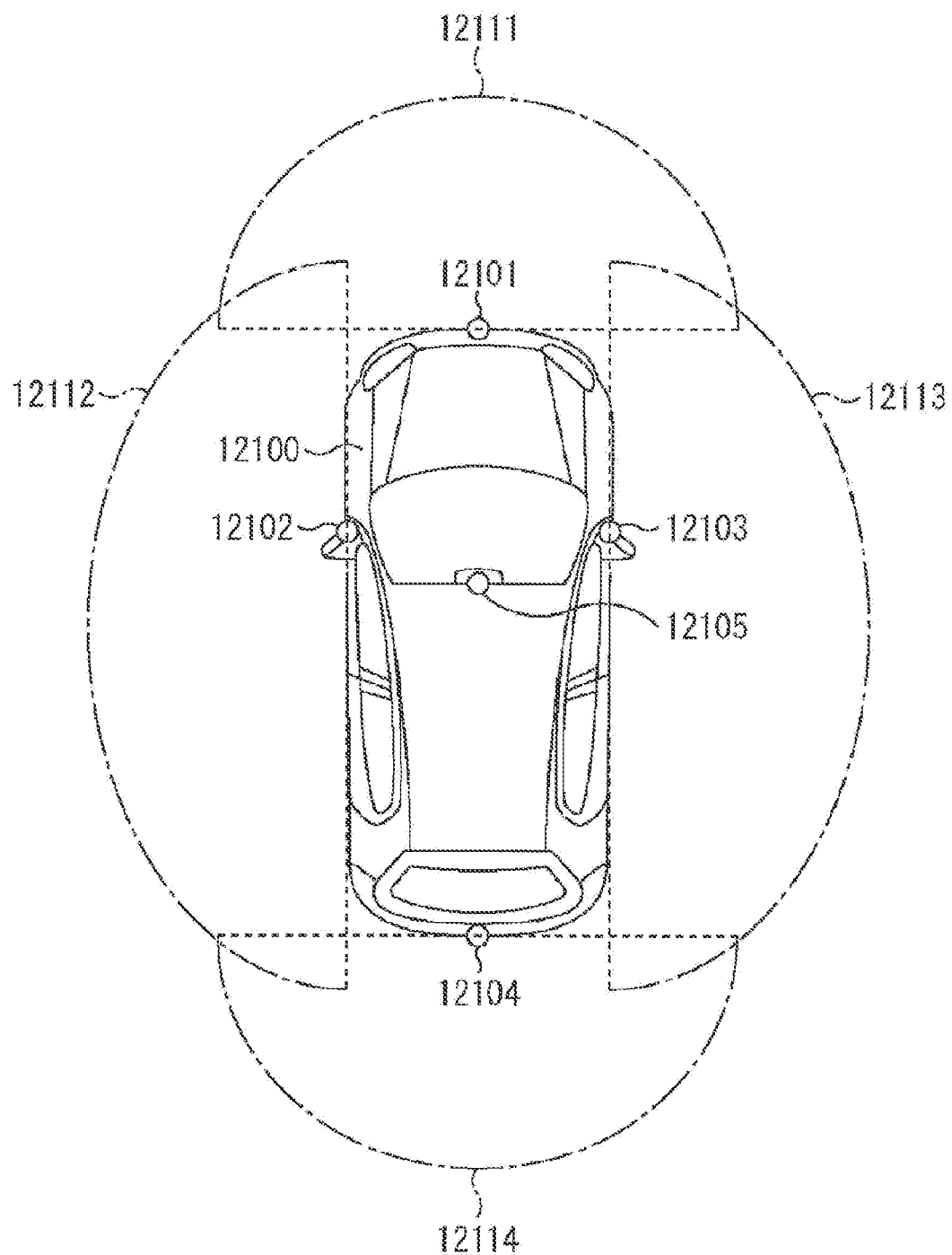

LIGHT-RECEIVING ELEMENT, MANUFACTURING METHOD OF THE SAME, IMAGING DEVICE, AND ELECTRONIC APPARATUS

CROSS REFERENCE TO RELATED APPLICATIONS

This application is a U.S. National Phase of International Patent Application No. PCT/JP2016/088923 filed on Dec. 27, 2016, which claims priority benefit of Japanese Patent Application No. JP 2016-004158 filed in the Japan Patent Office on Jan. 13, 2016 and also claims priority benefit of Japanese Patent Application No. JP 2016-220779 filed in the Japan Patent Office on Nov. 11, 2016. Each of the above-referenced applications is hereby incorporated herein by reference in its entirety.

TECHNICAL FIELD

The disclosure relates to a light-receiving element used in, for example, an infrared sensor or the like and its manufacturing method, an imaging device, and an electronic apparatus.

BACKGROUND ART

An image sensor (an infrared sensor) having sensitivity in an infrared region has been commercialized recently. In a light-receiving element used in this infrared sensor, a photoelectric conversion layer including a group III-V semiconductor, such as indium gallium arsenide (InGaAs), is used, and infrared rays are absorbed on the photoelectric conversion layer, thereby electric charges are generated (photoelectric conversion is performed). Various proposals on an element structure of such a light-receiving element or an imaging device have been made (for example, PTL 1).

CITATION LIST

Patent Literature

PTL 1: Japanese Unexamined Patent Application Publication No. 2014-127499

SUMMARY OF THE INVENTION

A light-receiving element described in above-described PTL 1 is provided with a semiconductor layer (a cap layer) on top of a photoelectric conversion layer, and a p-type region is formed in a selective region of this semiconductor layer. Accordingly, a p-n separation interface is formed on the semiconductor layer, which enables electrical separation from an adjacent pixel.

However, in an image sensor using such a compound semiconductor described above, a technology to separate a photoelectric conversion layer for each pixel has not been established, thus a photoelectric conversion layer is formed as a layer common to each pixel. Accordingly, an electric charge generated on the photoelectric conversion layer moves to an adjacent pixel, which causes signal crosstalk.

Therefore, it is desirable to provide a light-receiving element, a manufacturing method of the light-receiving element, an imaging device, and an electronic apparatus that make it possible to suppress signal crosstalk.

A light-receiving element in an embodiment of the disclosure includes a plurality of photoelectric conversion layers each of which includes a compound semiconductor, and absorbs a wavelength in an infrared region to generate an electric charge, and an insulating film that is provided to surround each of the plurality of photoelectric conversion layers.

A manufacturing method of a light-receiving element in an embodiment of the disclosure includes forming a plurality of photoelectric conversion layers each of which includes a compound semiconductor, and absorbs a wavelength in an infrared region to generate an electric charge, and forming an insulating film that surrounds each of the plurality of photoelectric conversion layers.

In the light-receiving element and the manufacturing method of the light-receiving element in the respective embodiments of the disclosure, the insulating film is provided to surround each of the plurality of photoelectric conversion layers each including the compound semiconductor, thereby the photoelectric conversion layers are electrically separated from one another. Accordingly, movement of an electric charge generated on each photoelectric conversion layer to an adjacent photoelectric conversion layer is suppressed.

An imaging device in an embodiment of the disclosure includes the above-described light-receiving element of the disclosure.

An electronic apparatus in an embodiment of the disclosure includes the above-described imaging device of the disclosure.

According to the light-receiving element, the manufacturing method of the light-receiving element, the imaging device, and the electronic apparatus of the respective embodiments of the disclosure, the insulating film is provided to surround each of the plurality of photoelectric conversion layers each including the compound semiconductor. This makes it possible to suppress movement of an electric charge generated on each photoelectric conversion layer to an adjacent photoelectric conversion layer. Therefore, it is possible to suppress signal crosstalk.

It is to be noted that the contents described above are merely an example of the disclosure. Effects of the disclosure are not limited to those described above; they may be other different effects, or may further include another effect.

BRIEF DESCRIPTION OF DRAWINGS

FIG. 1 is a cross-sectional view representing a configuration of a light-receiving element according to a first embodiment of the disclosure.

FIG. 2 is a schematic diagram for describing a planar configuration of a main section of the light-receiving element illustrated in FIG. 1.

FIG. 3A is a cross-sectional view for describing a process of a manufacturing method of the light-receiving element illustrated in FIG. 1.

FIG. 3B is a cross-sectional view representing a process subsequent to FIG. 3A.

FIG. 3C is a cross-sectional view representing a process subsequent to FIG. 3B.

FIG. 3D is a cross-sectional view representing a process subsequent to FIG. 3C.

FIG. 4 is a cross-sectional view representing a process subsequent to FIG. 3D.

FIG. 5 is a cross-sectional view representing a process subsequent to FIG. 4.

FIG. 6 is a cross-sectional view representing a process subsequent to FIG. 5.

FIG. 7 is a cross-sectional view representing a configuration and working of a light-receiving element according to a comparative example.

FIG. 8 is a cross-sectional view for describing working of the light-receiving element illustrated in FIG. 1.

FIG. 9 is a cross-sectional view representing a configuration of a light-receiving element according to a second embodiment of the disclosure.

FIG. 10A is a cross-sectional view for describing a process of a manufacturing method of the light-receiving element illustrated in FIG. 9.

FIG. 10B is a cross-sectional view representing a process subsequent to FIG. 10A.

FIG. 10C is a cross-sectional view representing a process subsequent to FIG. 10B.

FIG. 10D is a cross-sectional view representing a process subsequent to FIG. 10C.

FIG. 11 is a cross-sectional view representing a process subsequent to FIG. 10D.

FIG. 12 is a cross-sectional view representing a process subsequent to FIG. 11.

FIG. 13A is a cross-sectional view representing a process subsequent to FIG. 12.

FIG. 13B is a cross-sectional view representing a process subsequent to FIG. 13A.

FIG. 13C is a cross-sectional view representing a process subsequent to FIG. 13B.

FIG. 13D is a cross-sectional view representing a process subsequent to FIG. 13C.

FIG. 13E is a cross-sectional view representing a process subsequent to FIG. 13D.

FIG. 14 is a cross-sectional view representing a process subsequent to FIG. 13E.

FIG. 15 is a cross-sectional view representing a process subsequent to FIG. 14.

FIG. 16 is a cross-sectional view representing a configuration of a light-receiving element according to modification example 1.

FIG. 17 is a cross-sectional view representing a configuration of a light-receiving element according to modification example 2.

FIG. 18 is a cross-sectional view representing a configuration of a light-receiving element according to a third embodiment of the disclosure.

FIG. 19 is a schematic diagram for describing a planar configuration of a main section of the light-receiving element illustrated in FIG. 18.

FIG. 20A is a cross-sectional view for describing a process of a manufacturing method of the light-receiving element illustrated in FIG. 18.

FIG. 20B is a cross-sectional view representing a process subsequent to FIG. 20A.

FIG. 20C is a cross-sectional view representing a process subsequent to FIG. 20B.

FIG. 20D is a cross-sectional view representing a process subsequent to FIG. 20C.

FIG. 20E is a cross-sectional view representing a process subsequent to FIG. 20D.

FIG. 21A is a schematic diagram for describing a defect generated at an interface between an insulating film and a photoelectric conversion layer.

FIG. 21B is a schematic diagram for describing a defect generated at an interface between a passivation film and the photoelectric conversion layer.

FIG. 22A is a schematic diagram (1) for describing working of a pinning layer illustrated in FIG. 18.

FIG. 22B is a schematic diagram (2) for describing the working of the pinning layer illustrated in FIG. 18.

FIG. 23 is a cross-sectional view representing a configuration of a light-receiving element according to modification example 3.

FIG. 24 is a cross-sectional view representing another example of the light-receiving element illustrated in FIG. 23.

FIG. 25 is a cross-sectional view for describing a process of a manufacturing method of the light-receiving element illustrated in FIG. 23.

FIG. 26 is a cross-sectional view representing a configuration of a light-receiving element according to modification example 4.

FIG. 27 is a block diagram representing a configuration of an imaging device.

FIG. 28 is a schematic diagram representing a configuration example of a stacked imaging device.

FIG. 29 is a functional block diagram representing an example of an electronic apparatus (a camera) using the imaging device illustrated in FIG. 27.

FIG. 30 is a view depicting an example of a schematic configuration of an endoscopic surgery system.

FIG. 31 is a block diagram depicting an example of a functional configuration of a camera head and a camera control unit (CCU).

FIG. 32 is a block diagram depicting an example of schematic configuration of a vehicle control system.

FIG. 33 is a diagram of assistance in explaining an example of installation positions of an outside-vehicle information detecting section and an imaging section.

MODES FOR CARRYING OUT THE INVENTION

In the following, embodiments of the disclosure are described in detail with reference to the drawings. It is to be noted that description is made in the following order:
1. First Embodiment (An example of a light-receiving element provided with an insulating film that surrounds each of a plurality of photoelectric conversion layers)
2. Second Embodiment (An example of a light-receiving element in a case where each photoelectric conversion layer is formed by using a Si substrate)
3. Modification Example 1 (An example of a case where two electrodes are provided)
4. Modification Example 2 (An example of a case where a gap between photoelectric conversion layers is filled with an insulating film)
5. Third Embodiment (An example where a pinning layer is provided between a photoelectric conversion layer and a passivation film)
6. Modification Example 3 (An example where there is a pinning formation film)
7. Modification Example 4 (An example where a pinning layer is provided between a photoelectric conversion layer and an insulating film)
8. Application Example 1 (An example of an imaging device)
9. Application Example 2 (An example of an electronic apparatus)
10. Example of Practical Application 1 (An example of practical application to an endoscopic surgical system)
11. Example of Practical Application 2 (An example of practical application to a moving body).

First Embodiment

[Configuration]

FIG. 1 represents a cross-sectional configuration of a light-receiving element (a light-receiving element 1) in a first embodiment of the disclosure. FIG. 2 represents a planar configuration of a main section of the light-receiving element 1. The light-receiving element 1 is applied to, for example, an infrared sensor or the like using a compound semiconductor (a group III-V semiconductor), and includes, for example, a plurality of two-dimensionally disposed light-receiving unit regions (pixels P). It is to be noted that FIG. 1 illustrates a cross-sectional configuration of a portion corresponding to two pixels P.

The light-receiving element 1 is provided with a photoelectric conversion layer 12 including a compound semiconductor (a group III-V semiconductor). In this light-receiving element 1, a plurality of photoelectric conversion layers 12 are formed, for example, on one face (a face S1) of a substrate 11, and an electrode 13 is electrically coupled to each photoelectric conversion layer 12. An on-chip lens 17 is formed for each pixel P on a light-incidence-side face (a face S2) of the substrate 11. A protective film 16 is formed on the electrodes 13 side (the side opposite to the light incidence side) of the light-receiving element 1.

As illustrated in FIG. 2, in this light-receiving element 1, the plurality of photoelectric conversion layers 12 are discretely disposed (each being in an island-like shape) in a planar view. An insulating film 15 is so formed as to surround each of the plurality of photoelectric conversion layers 12. A passivation film 14 is so formed as to cover at least a portion of each photoelectric conversion layer 12, for example, a side face 12b. The insulating film 15 is so formed as to fill regions between the plurality of photoelectric conversion layers 12 (regions between pixels) covered with the passivation films 14.

It is to be noted that a silicon semiconductor substrate (a substrate 2B including a circuit unit 20 to be described later) on which a pixel circuit and various wires for performing signal readout from each pixel P are formed is stacked on the electrode 13. The electrode 13 is electrically coupled to various circuits formed on the silicon semiconductor substrate through, for example, a bump, a via, etc. Respective configurations of the components are described below.

The substrate 11 includes, for example, a p-type or n-type compound semiconductor, such as indium phosphide (InP). Here, the photoelectric conversion layer 12 is formed on the face S1 of the substrate 11 in a manner to be in contact with the substrate 11; however, another layer may intervene between the substrate 11 and the photoelectric conversion layer 12. Examples of material of the layer intervening between the substrate 11 and the photoelectric conversion layer 12 include semiconductor materials such as InAlAs, Ge, Si, GaAs, and InP; however, it is desirable to select material that is lattice-matched to both the substrate 11 and the photoelectric conversion layer 12.

The photoelectric conversion layer 12 includes a compound semiconductor (for example, a p-type or n-type compound semiconductor) that absorbs, for example, a wavelength of an infrared region (an infrared ray IR) and generates electric charges (an electron and a hole). In the present embodiment, this photoelectric conversion layer 12 is separately provided for each pixel P.

The compound semiconductor used in the photoelectric conversion layer 12 is, for example, indium gallium arsenide (InGaAs). Its composition is, for example, $In_xGa_{(1-x)}As$ (x: $0<x\leq1$). However, to obtain higher sensitivity in an infrared region, $x\geq0.4$ is desirable. The composition of the photoelectric conversion layer 12 lattice-matched to the substrate 11 including InP is, for example, $In_{0.53}Ga_{0.47}As$. Impurity elements contained in the photoelectric conversion layer 12 include, for example, zinc (Zn) and silicon (Si).

The electrode 13 is an electrode that is supplied with a voltage for reading out an electric charge (a hole or an electron) generated in the photoelectric conversion layer 12, and is formed for each pixel P. Constituent material of this electrode 13 is, for example, any single one of titanium (Ti), tungsten (W), titanium nitride (TiN), platinum (Pt), gold (Au), germanium (Ge), nickel (Ni), and aluminum (Al) or an alloy containing at least one of these.

This electrode 13 is coupled to, for example, a selective region of an upper face (a face 12a) of the photoelectric conversion layer 12. Here, the electrode 13 is provided for each pixel P, and is formed in an opening h1 (a first opening) provided on the passivation film 14 and the protective film 16; the electrode 13 is in contact with the face 12a of the photoelectric conversion layer 12 through this opening h1. However, a plurality of electrodes 13 may be provided per pixel P. Furthermore, in a case where a plurality of electrodes 13 are provided per pixel P, some of these electrodes 13 may include an electrode (a dummy electrode) that does not actually contribute to taking out an electric charge.

The passivation film 14 is so formed as to cover at least a portion of a surface of the photoelectric conversion layer 12, for example, the side face 12b. In the present embodiment, the passivation film 14 is so formed as to cover, of the surface of the photoelectric conversion layer 12, a portion excluding a portion facing the substrate 11 (specifically, a face 12c in contact with the face S1 of the substrate 11) and a portion coupled to the electrode 13 (specifically, a portion of the face 12a in contact with the electrode 13).

This passivation film 14 includes an insulator or semiconductor that is less likely to form a defect at an interface with the compound semiconductor included in the photoelectric conversion layer 12. Examples of such an insulator include high-dielectric constant material, such as aluminum oxide ($Al_2O_3$), and silicon nitride (SiN). In a case where a semiconductor is used in the passivation film 14, it is desirable to select material having a wider band gap than that of the photoelectric conversion layer 12. As an example, in a case where the photoelectric conversion layer 12 includes $In_{0.53}Ga_{0.47}As$ (with a band gap of 0.74 eV), it is desirable that the passivation film 14 is InP (with a band gap of 1.34 eV), InAlAs, or Si.

The insulating film 15 includes an oxide such as silicon oxide ($SiO_x$). This insulating film 15 is so formed as to surround each of the plurality of photoelectric conversion layers 12, and electrically separates the photoelectric conversion layer 12 for each pixel P. In the present embodiment, as described above, the insulating film 15 is formed to fill regions between the photoelectric conversion layers 12 covered with the passivation films 14. In other words, the passivation film 14 intervenes between the insulating film 15 and the photoelectric conversion layer 12, and the insulating film 15 is structured not to have direct contact with the photoelectric conversion layer 12.

The protective film 16 includes inorganic insulating material, for example, at least one of silicon nitride (SiN), aluminum oxide ($Al_2O_3$), and hafnium oxide ($HfO_2$). The protective film 16 may be a single layer film, or may be a laminated film.

The on-chip lens 17 concentrates incident light (infrared rays) toward the photoelectric conversion layer 12. This on-chip lens 17 may be provided as needed. Furthermore, a shape of the on-chip lens 17 is not limited to that illustrated in the drawings. It is to be noted that in a case where the light-receiving element 1 is used for detecting not only infrared rays but also visible light, a color filter may be further provided, for example, between the substrate 11 and the on-chip lens 17.

[Manufacturing Method]

The light-receiving element 1 can be manufactured, for example, as follows. FIGS. 3A, 3B, 3C, 3D, 4, 5, and 6 illustrate a manufacturing process of the light-receiving element 1 in processing order. It is to be noted that in FIGS. 3A, 3B, 3C, 3D, 4, 5, and 6, only a region corresponding to one pixel P is illustrated for simplicity.

First, the photoelectric conversion layer 12 including the above-described material is formed on, for example, a selective region on the substrate 11 (a first substrate) including InP. At this time, first, an oxide film 51 is patterned on the face S1 of the substrate 11 as illustrated in FIG. 3A. Specifically, the oxide film 51 including, for example, silicon oxide is formed on the face S1 of the substrate 11, following which an opening 51a (a second opening) is formed by using, for example, photolithography and dry etching. The opening 51a is formed for each pixel P.

Then, as illustrated in FIG. 3B, the photoelectric conversion layer 12 including, for example, InGaAs is formed in the opening 51a by selective epitaxial growth. By making InGaAs grow on the substrate 11 including InP, InP and InGaAs are easily lattice-matched, which makes it possible to suppress a crystal defect in the photoelectric conversion layer 12 at the minimum level.

Thereafter, as illustrated in FIG. 3C, a portion of the photoelectric conversion layer 12 that has grown beyond an upper face of the oxide film 51 is removed, and the upper face (the face 12a) is planarized by CMP (Chemical Mechanical Polishing: chemical mechanical polishing), for example.

Then, as illustrated in FIG. 3D, the oxide film 51 is selectively removed by, for example, etching. At this time, a chemical is used which makes it possible to ensure etching selection ratio between the substrate 11 (InP) and the photoelectric conversion layer 12 (InGaAs), and the oxide film 51. Examples of the chemical include a hydrofluoric acid-based chemical. The process in this way makes it possible to form the photoelectric conversion layer 12 on the selective region of the substrate 11, i.e., makes it possible to form the plurality of photoelectric conversion layers 12 each in an island-like shape on the substrate 11.

Next, as illustrated in FIG. 4, the passivation film 14 including the above-described material is formed by, for example, chemical vapor deposition (CVD), atomic layer deposition (ALD), or the like. Accordingly, the passivation film 14 is so formed as to cover the face 12a and the side face 12b of the photoelectric conversion layer 12.

Thereafter, as illustrated in FIG. 5, the insulating film 15 including the above-described material is formed. Specifically, a film of the insulating film 15 is so formed by using, for example, CVD or the like as to fill a gap between the photoelectric conversion layers 12 covered with the passivation films 14, following which the surface thereof is planarized by using, for example, CMP.

Then, as illustrated in FIG. 6, the electrode 13 including the above-described material is formed. Specifically, first, the protective film 16 including the above-described material is formed over the entire surfaces of the passivation film 14 and the insulating film 15 by using, for example, CVD, sputtering, or the like. Next, respective portions of the passivation film 14 and the protective film 16 corresponding to the face 12a of the photoelectric conversion layer 12 are opened (the opening h1 is formed), and the electrode 13 is formed in this opening h1. Specifically, a film of the electrode 13 including the above-described material is so formed by, for example, CVD, plasma CVD, thermal CVD, ALD, a vapor deposition method, or the like as to fill the opening h1, and then is patterned by using photolithography and etching. Accordingly, of the surface of the photoelectric conversion layer 12, a portion excluding a portion facing the substrate 11 and a portion coupled to the electrode 13 is covered with the passivation film 14.

Finally, the on-chip lens 17 is formed or attached on the side of the face S2 of the substrate 11, thereby the light-receiving element 1 illustrated in FIG. 1 is completed.

[Working and Effects]

In the light-receiving element 1 in the present embodiment, when an infrared ray IR enters the photoelectric conversion layer 12 through the on-chip lens 17 and the substrate 11, the infrared ray IR is absorbed in the photoelectric conversion layer 12. Accordingly, a pair of a hole (hole) and an electron is generated (photoelectrically converted) in the photoelectric conversion layer 12. At this time, for example, if a predetermined voltage is applied to the electrode 13, a potential gradient occurs in the photoelectric conversion layer 12, and one of generated electric charges is collected, as a signal charge, to the side of the electrode 13. This signal charge is read by a pixel circuit (not illustrated) through the electrode 13.

In this light-receiving element 1, the plurality of photoelectric conversion layers 12 each including a compound semiconductor (for example, a group III-V semiconductor such as InGaAs) for the respective pixels P are formed on the face S1 of the substrate 11. The electrode 13 is electrically coupled to each photoelectric conversion layer 12.

Here, FIG. 7 illustrates a cross-sectional configuration of a light-receiving element 100 according to a comparative example of the present embodiment. It is to be noted that only a region corresponding to two pixels 101 is illustrated in FIG. 7. In the light-receiving element 100, a buffer layer 103 including InP, a photoelectric conversion layer 104 including InGaAs, and a cap layer 105 including InP are stacked on the side of one face of a substrate 102 including InP. A protective film 107 having an opening 107a is provided to cover a surface of the cap layer 105. The cap layer 105 and a first electrode 106 are electrically coupled through the opening 107a of this protective film 107. A second electrode 108 is formed on a light-incidence-side face of the substrate 102.

In this light-receiving element 100, the n-type cap layer 105 includes a p-type region 105a in a selective region facing the first electrode 106. Accordingly, a p-n separation interface is formed on the cap layer 105. The cap layer 105 is electrically separated between the pixels 101 by this p-n separation interface. However, in the light-receiving element 100 in this comparative example, the photoelectric conversion layer 104 is formed as a layer common to the pixels 101. Therefore, electric charges (an electron e1 and a hole e2) move between the adjacent pixels 101 through the photoelectric conversion layer 104. That is, signal crosstalk occurs.

Here, in a CMOS image sensor using silicon (Si), for example, an impurity doping technology using ion implantation is established, and therefore, it is possible to easily dope a selective region of a photoelectric conversion layer (Si) with an impurity. This allows the photoelectric conversion layer to be separated for each pixel by impurity doping. However, in a case where a compound semiconductor, such as InGaAs, is doped with an impurity by using ion implantation, a crystal defect is induced. It is difficult for such a crystal defect to be recovered by activation annealing, and the crystal defect causes generation of dark current. Besides this, a technique to physically separate InGaAs by dry etching is also possible; however, in this case, a crystal defect is generated on a face subjected to etching, which may vary the composition.

On the other hand, in the light-receiving element 1 in the present embodiment, the plurality of photoelectric conversion layers 12 are formed on the substrate 11 as described above, and the insulating film 15 is so formed as to surround each of the plurality of photoelectric conversion layers 12. Accordingly, as illustrated in FIG. 8, the photoelectric conversion layer 12 is physically and electrically separated for each pixel P. Consequently, movement of an electric charge (an electron e1 or a hole e2) generated in each photoelectric conversion layer 12 to the photoelectric conversion layer 12 of an adjacent pixel P is suppressed. Therefore, it is possible to suppress signal crosstalk.

Furthermore, in the light-receiving element 1, it is desirable that at least a portion of the surface of each photoelectric conversion layer 12, for example, the side face 12b is covered with the passivation film 14, as in the present embodiment. Here, if the photoelectric conversion layer 12 including a group III-V semiconductor is in contact with the insulating film 15 including silicon oxide, its interface is likely to have a defect. Moreover, since the band gap of the group III-V semiconductor is relatively narrow, the interface recombination velocity increases. From these matters, when the photoelectric conversion layer 12 is in contact with the insulating film 15, dark current may be generated near the interface. Since the dark current becomes a noise in a light-receiving signal, it is desirable that the dark current be suppressed.

The passivation film 14 including the above-described insulator or semiconductor is so formed as to cover the side face 12b of the photoelectric conversion layer 12, as in the present embodiment, making it possible to reduce the interface defect density. Therefore, it is possible to suppress dark current while suppressing signal crosstalk.

Furthermore, in the present embodiment, the passivation film 14 is so formed as to cover, of the surface of the photoelectric conversion layer 12, a portion excluding a portion facing the substrate 11 and a portion coupled to the electrode 13. That is, it is possible to achieve a structure in which the photoelectric conversion layer 12 does not have a direct contact with the insulating film 15 and the protective film 16, which makes it possible to enhance the dark current suppressing effect.

As described above, in the present embodiment, the plurality of photoelectric conversion layers 12 each including a compound semiconductor are formed on the face Si of the substrate 11, and the insulating film 15 is so formed as to surround each of the plurality of photoelectric conversion layers 12. Accordingly, it is possible to separate the photoelectric conversion layer 12 for each pixel P, which makes it possible to suppress signal crosstalk.

Subsequently, another embodiment and modification examples of the above-described first embodiment are described. In the following, a component similar to that of the above first embodiment is assigned the same reference numeral, and description of the component is appropriately omitted.

Second Embodiment

FIG. 9 represents a cross-sectional configuration of a light-receiving element (a light-receiving element 1A) in a second embodiment of the disclosure. Similarly to the light-receiving element 1 in the above-described first embodiment, the light-receiving element 1A in the present embodiment is also applied to, for example, an infrared sensor or the like using a compound semiconductor (a group III-V semiconductor), and includes, for example, a plurality of two-dimensionally disposed light-receiving unit regions (pixels P). It is to be noted that FIG. 9 illustrates a cross-sectional configuration of a portion corresponding to two pixels P.

Similarly to the light-receiving element 1 in the above-described first embodiment, the light-receiving element 1A is provided with the plurality of photoelectric conversion layers 12 each including a compound semiconductor (a group III-V semiconductor). The electrode 13 is electrically coupled to each photoelectric conversion layer 12, and the on-chip lenses 17 for the respective pixels P are formed on the light incidence side of the photoelectric conversion layer 12. The protective film 16 is formed on the electrodes 13 side (the side opposite to the light incidence side) of the light-receiving element 1A.

Furthermore, also in the light-receiving element 1A in the present embodiment, similarly to the light-receiving element 1 in the above-described first embodiment, the insulating film 15 is so formed as to surround each of the plurality of photoelectric conversion layers 12. Moreover, passivation films (passivation films 14A and 14B) are so formed as to cover at least a portion of the photoelectric conversion layer 12, for example, the side face 12b. The insulating film 15 is so formed as to fill regions between the plurality of photoelectric conversion layers 12 (regions between pixels) covered with the passivation film 14B. It is to be noted that the passivation film 14A in the present embodiment corresponds to a specific example of a "first passivation film" in the disclosure, and the passivation film 14B corresponds to a specific example of a "passivation film" and a "second passivation film" in the disclosure.

However, unlike the above-described first embodiment, the present embodiment has a configuration in which the substrate 11 including InP does not intervene between the photoelectric conversion layer 12 and the on-chip lens 17. Furthermore, the passivation film 14A is formed on the side of the face 12a of the photoelectric conversion layer 12. Of the surface of the photoelectric conversion layer 12, a portion excluding a portion coupled to the electrode 13 is covered with the passivation films 14A and 14B. Specifically, the passivation film 14A covers, of the face 12a of the photoelectric conversion layer 12, a portion excluding the portion coupled to the electrode 13. The passivation film 14B is so formed as to cover the side face 12b and the light-incidence-side face 12c of the photoelectric conversion layer 12. In the above-described embodiment, the photoelectric conversion layer 12 is formed by using the substrate 11 including InP; however, an element structure in the present embodiment is achieved by forming the photoelectric conversion layer 12 by using a silicon substrate.

The passivation films 14A and 14B include a similar insulator or semiconductor to that of the passivation film 14 in the above-described first embodiment. It is to be noted that the electrode 13 is formed in an opening h2 (a third opening) provided on the passivation film 14A and the protective film 16, and is in contact with the face 12a of the photoelectric conversion layer 12 through this opening h2.

It is possible to manufacture the light-receiving element 1A described above, for example, as follows. FIGS. 10A, 10B, 10C, 10D, 11, 12, 13A, 13B, 13C, 13D, 13E, 14, and 15 illustrate a manufacturing process of the light-receiving element 1A in processing order.

First, as illustrated in FIG. 10A, a substrate 52 (a second substrate) including, for example, silicon (Si) is prepared. An oxide film 53 including, for example, silicon oxide is formed on this substrate 52. Then, as illustrated in FIG. 10B, the formed oxide film 53 is patterned by using, for example, photolithography and dry etching, to thereby form an opening 53a (a fourth opening). The plurality of openings 53a are formed for the respective pixels P, and each include portions a1 and a2 that have different opening widths from each other. The portion a2 is, for example, an opening portion in which the photoelectric conversion layer 12 is formed. The portion a1 has a higher aspect ratio than the portion a2, and is formed as a trench or a hole between the portion a2 and the substrate 52.

Then, as illustrated in FIG. 10C, a buffer layer 54 (a first layer) including, for example, InP and the photoelectric conversion layer 12 (a second layer) including InGaAs are formed in this order in the opening 53a by selective epitaxial growth. Here, in a case where a film of InGaAs is directly formed on a Si substrate, because about 8% lattice mismatch occurs, a defect is likely to be generated; however, by allowing InP to epitaxially grow in the portion 1a having a high aspect ratio, the defect is trapped in the oxide film 53. This makes it possible to reduce the defect density of InGaAs formed in the portion a2.

Thereafter, as illustrated in FIG. 10D, a portion of the photoelectric conversion layer 12 that has grown beyond an upper face of the oxide film 53 is removed, and the upper face (the face 12a) is planarized.

Then, as illustrated in FIG. 11, the passivation film 14A including the above-described material and the protective film 16 are formed in this order by, for example, CVD or the like. Accordingly, the passivation film 14A is formed to cover the face 12a of the photoelectric conversion layer 12.

Next, as illustrated in FIG. 12, the electrode 13 including the above-described material is formed. Specifically, respective portions of the passivation film 14A and the protective film 16 corresponding to the face 12a of the photoelectric conversion layer 12 are opened (the opening h2 is formed), and the electrode 13 is formed in this opening h2. Specifically, a film of the electrode 13 including the above-described material is formed by, for example, CVD, plasma CVD, thermal CVD, ALD, a vapor deposition method, or the like so as to fill the opening h2, and then is patterned by using photolithography and etching. Accordingly, of the face 12a of the photoelectric conversion layer 12, a portion excluding a portion coupled to the electrode 13 is covered with the passivation film 14A.

Thereafter, the substrate 52 is removed (peeled off). Specifically, as illustrated in FIG. 13A, a substrate 55 (a third substrate) including Si is attached on the side of the electrode 13, and thereafter, as illustrated in FIG. 13B, the substrate 52 is peeled off from the oxide film 53. The substrate 55 is, for example, a silicon semiconductor substrate including various circuits, and is electrically coupled to the electrode 13 through, for example, a bump, a via, etc.

Then, as illustrated in FIG. 13C, the buffer layer 54 is selectively removed. Next, as illustrated in FIG. 13D, while respective portions of the oxide film 53 and the photoelectric conversion layer 12 are removed by using, for example, CMP, the face (the face 12c) of the photoelectric conversion layer 12 is planarized.

Thereafter, as illustrated in FIG. 13E, the oxide film 53 is selectively removed by, for example, etching. The process in this way makes it possible to form the photoelectric conversion layer 12 on a selective region of each pixel P, i.e., makes it possible to form the plurality of photoelectric conversion layers 12 discretely in a planar view.

Next, as illustrated in FIG. 14, the passivation film 14B including the above-described material is formed by, for example, CVD, ALD, or the like. Accordingly, the passivation film 14B is formed to cover the side face 12b and the face 12c of the photoelectric conversion layer 12.

Thereafter, as illustrated in FIG. 15, the insulating film 15 including the above-described material is formed. Specifically, the insulating film 15 is formed by using, for example, CVD or the like so as to fill a gap between the photoelectric conversion layers 12 covered with the passivation films 14B, following which the surface is planarized by using, for example, CMP.

Finally, the on-chip lens 17 is formed or attached on the side of the passivation film 14B and the insulating film 15, thereby the light-receiving element 1A illustrated in FIG. 9 is completed.

In the light-receiving element 1A in the present embodiment, similarly to the light-receiving element 1 in the above-described first embodiment, when an infrared ray IR enters the photoelectric conversion layer 12, this infrared ray IR is absorbed by the photoelectric conversion layer 12 and is photoelectrically converted. At this time, for example, by applying a predetermined voltage to the electrode 13, a signal charge is read out through the electrode 13.

Also in this light-receiving element 1A, the plurality of photoelectric conversion layers 12 are discretely formed from one another, and the insulating film 15 is so formed as to surround each of the photoelectric conversion layers 12. This makes it possible to separate each photoelectric conversion layer 12 for each pixel P. Furthermore, the passivation film 14B is so formed as to cover the side face 12b of each photoelectric conversion layer 12, making it possible to reduce interface defects and suppress generation of dark current. Therefore, it is possible to obtain similar effects to the above-described first embodiment.

Modification Example 1

FIG. 16 represents a cross-sectional configuration of a light-receiving element (a light-receiving element 1B) according to modification example 1. In the above-described embodiment, there is described an example of an element structure in which a signal charge is read by using one electrode 13; however, two electrodes for signal readout may be provided. That is, as in the light-receiving element 1B in this modification example, a light-receiving element may be provided with an electrode (a first electrode 13A) coupled to the photoelectric conversion layer 12 and an electrode (a second electrode 13B) coupled to the substrate 11.

The first electrode 13A is, similarly to the electrode 13 in the above-described first embodiment, an electrode on the side of collecting a signal charge, and is coupled to a silicon semiconductor substrate (not illustrated). Similar constituent material to that of the electrode 13 in the above-described first embodiment can be used as this first electrode 13A.

The second electrode 13B is provided, for example, as an electrode common to the pixels P, on the face S2 (the light-incidence-side face) of the substrate 11. It is to be noted that in a case where, of electric charges generated in the photoelectric conversion layer 12, for example, a hole is read out as a signal charge through the first electrode 13A, for example, an electron can be discharged through this second electrode 13B. Furthermore, as long as the second electrode 13B is electrically coupled to the substrate 11, the second electrode 13B does not necessarily have to be formed over the entire face S2 of the substrate 11. This second electrode 13B includes a conductive film that allows an infrared ray to transmit therethrough.

The first electrode 13A and the second electrode 13B may be provided as in this modification example, and, also in this case, it is possible to obtain similar effects to the above-described first embodiment. In addition, it becomes easy to form a higher potential gradient in the photoelectric conversion layer 12. Furthermore, it is possible to discharge an electric charge that is not read out as a signal charge, of electric charges generated by a photoelectric conversion, from the photoelectric conversion layer 12 through the second electrode 13B.

Modification Example 2

FIG. 17 represents a cross-sectional configuration of a light-receiving element (a light-receiving element 1C) according to modification example 2. In the above-described embodiment, there is described an example of a configuration in which the insulating film 15 is provided to surround each of the plurality of photoelectric conversion layers 12, and the side face 12b of each photoelectric conversion layer 12 is covered with the passivation film 14; however, a gap between the photoelectric conversion layers 12 may be filled with a predetermined insulating film 18, as in this modification example.

Similarly to the passivation film 14 in the above-described first embodiment, the insulating film 18 is so formed as to cover at least a portion of the surface of the photoelectric conversion layer 12, for example, the side face 12b. Specifically, the insulating film 18 is so formed as to cover, of the surface of the photoelectric conversion layer 12, a portion excluding a portion (the face 12c) facing the substrate 11 and a portion coupled to the electrode 13 (a portion of the face 12a in contact with the electrode 13) and also fill a gap between the photoelectric conversion layers 12 (regions between pixels).

Similarly to the passivation film 14 in the above-described first embodiment, this insulating film 18 includes an insulator or semiconductor that is able to reduce the defect density in an interface with a compound semiconductor included in the photoelectric conversion layer 12. Examples of such an insulator include high-dielectric constant material, such as aluminum oxide ($Al_2O_3$), and silicon nitride (SiN). In a case where a semiconductor is used in the insulating film 18, it is desirable to select a material having a wider band gap than that of the photoelectric conversion layer 12. As an example, in a case where the photoelectric conversion layer 12 includes $In_{0.53}Ga_{0.47}As$, it is desirable that the insulating film 18 is InP, InAlAs, or Si.

The insulating film 18 described above may be provided to fill a gap between the plurality of photoelectric conversion layers 12, as in this modification example, and, also in this case, it is possible to obtain similar effects to the above-described first embodiment.

Third Embodiment

FIG. 18 represents a cross-sectional configuration of a light-receiving element (a light-receiving element 1D) in a third embodiment of the disclosure; FIG. 19 represents a planar configuration of a main section of the light-receiving element 1D. Similarly to the light-receiving element 1 in the above-described first embodiment, the light-receiving element 1D in the present embodiment is also applied to, for example, an infrared sensor or the like using a compound semiconductor (a group III-V semiconductor), and includes, for example, a plurality of two-dimensionally disposed light-receiving unit regions (pixels P). It is to be noted that FIG. 18 illustrates a cross-sectional configuration of a portion corresponding to two pixels P.

Similarly to the light-receiving element 1 in the above-described first embodiment, the light-receiving element 1D is provided with the plurality of photoelectric conversion layers 12 each including a compound semiconductor (a group III-V semiconductor). The electrode 13 is electrically coupled to each photoelectric conversion layer 12, and the on-chip lens 17 is formed for each pixel P on the light incidence side of the photoelectric conversion layer 12. The protective film 16 is formed on the electrodes 13 side (the side opposite to the light incidence side) of the light-receiving element 1D.

Furthermore, also in the light-receiving element 1D in the present embodiment, similarly to the light-receiving element 1 in the above-described first embodiment, the insulating film 15 is so formed as to surround each of the plurality of photoelectric conversion layers 12. Moreover, the insulating film 15 is formed so as to fill regions between the plurality of photoelectric conversion layers 12 (regions between pixels) covered with the passivation films 14.

However, in the present embodiment, unlike the above-described first embodiment, a pinning layer 12p is provided between the photoelectric conversion layer 12 and the insulating film 15, more specifically, between the photoelectric conversion layer 12 and the passivation film 14. Although the details will be described later, this makes it possible to suppress dark current due to an interface defect of the photoelectric conversion layer 12 more effectively.

As illustrated in FIG. 19, the pinning layer 12p is provided on a periphery of the photoelectric conversion layer 12 so as to surround the side face of the photoelectric conversion layer 12. This pinning layer 12p performs pinning to a carrier generated due to a defect at an interface between the photoelectric conversion layer 12 and the passivation films 14, and has, as a carrier, an electric charge (a second electric charge) opposite to a signal charge (a first electric charge). For example, when a signal charge is a hole, the pinning layer 12p includes n-type InGaAs. When a signal charge is an electron, the pinning layer 12p includes p-type InGaAs.

A contact layer 61 may be provided between the photoelectric conversion layer 12 and the electrode 13. A compound semiconductor such as InP can be used in the contact layer 61. A portion of the contact layer 61 in contact with the electrode 13 is provided with a diffusion region 61c. The diffusion region 61c is a region in which an n-type or p-type impurity is diffused. For example, when a signal charge is a hole, the diffusion region 61c is a p-type region. The pinning layer 12p is also provided on a side of the contact layer 61 continuously from the photoelectric conversion layer 12.

It is possible to manufacture the light-receiving element 1D described above, for example, as follows. FIGS. 20A, 20B, 20C, 20D, and 20E illustrate a manufacturing process of the light-receiving element 1D in processing order.

First, the photoelectric conversion layer 12 is formed in the opening 51a of the oxide film 51 in the same manner as described in the above first embodiment (see FIGS. 3A and 3B). Next, as illustrated in FIG. 20A, the contact layer 61 including, for example, InP is formed on the photoelectric conversion layer 12 by epitaxial growth.

Thereafter, as illustrated in FIG. 20B, a portion of the contact layer 61 that has grown beyond the upper face of the oxide film 51 is removed and an upper face of the contact layer 61 is planarized by, for example, CMP.

Then, as illustrated in FIG. 20C, an impurity, such as Zn, is diffused on an exposed face (the upper face) of the contact layer 61, thereby forming the diffusion region 61c. Next, the oxide film 51 is removed in the same manner as described in the above first embodiment (FIG. 20D).

Thereafter, as illustrated in FIG. 20E, the pinning layer 12p is formed on the side face of the photoelectric conversion layer 12 and the side face of the contact layer 61. The pinning layer 12p is formed by, for example, doping a compound semiconductor layer (the photoelectric conversion layer 12 and the contact layer 61) with an impurity. The doping may be, for example, doping by solid-phase diffusion, or may be doping by ion implantation.

After the pinning layer 12p having been formed, the passivation film 14, the insulating film 15, the protective film 16, the electrode 13, and the on-chip lens 17 are formed in the same manner as described in the above first embodiment, thereby the light-receiving element 1D is completed.

In FIGS. 20A, 20B, 20C, 20D, and 20E, the case where the photoelectric conversion layer 12 is formed on, for example, the substrate 11 including InP is described; however, as described in the above second embodiment, the photoelectric conversion layer 12 may be formed by using the substrate 52 including silicon (see FIGS. 10A, 10B, 10C, 10D, 11, 12, 13A, 13B, 13C, 13D, 13E, 14, and 15).

In the light-receiving element 1D in the present embodiment, similarly to the light-receiving element 1 in the above-described first embodiment, when an infrared ray IR enters the photoelectric conversion layer 12, this infrared ray IR is absorbed by the photoelectric conversion layer 12 and is photoelectrically converted. At this time, for example, by applying a predetermined voltage to the electrode 13, a signal charge is read out through the electrode 13.

Also in this light-receiving element 1D, the plurality of photoelectric conversion layers 12 are discretely formed from one another, and the insulating film 15 is so formed as to surround each of the photoelectric conversion layers 12. This makes it possible to separate each photoelectric conversion layer 12 for each pixel P. In addition, the pinning layer 12p is provided between the photoelectric conversion layer 12 and the passivation film 14 in the light-receiving element 1D, which makes it possible to suppress generation of dark current more effectively. This is described below with FIGS. 21A, 21B, 22A and 22B.

As described in the above first embodiment, when the photoelectric conversion layer 12 is in contact with the insulating film 15, dark current is likely to be generated due to a defect at the interface (FIG. 21A). By providing the passivation films 14 between the photoelectric conversion layer 12 and the insulating film 15 as illustrated in FIG. 21B, the interface defect density is reduced; however, there remains room for improvement.

In the present embodiment, the pinning layer 12p is provided on the side face of the photoelectric conversion layer 12, and therefore a carrier generated due to a defect at the interface between the photoelectric conversion layer 12 and the passivation films 14 is subjected to pinning. For example, when a signal charge is a hole, a carrier (a hole) due to an interface defect is recombined with an electron accumulated in the pinning layer 12p as illustrated in FIGS. 22A and 22B. This allows dark current to be suppressed more effectively. Therefore, this light-receiving element 1D allows dark current to be suppressed more effectively than the light-receiving element 1, while suppressing signal crosstalk.

Modification Example 3

FIGS. 23 and 24 represent a cross-sectional configuration of a light-receiving element (a light-receiving element 1E) according to a modification example (modification example 3) of the above-described third embodiment. In the above-described third embodiment, there is described the case where the pinning layer 12p is formed through doping by solid-phase diffusion or doping by ion implantation; however, the pinning layer 12p may be formed by using a pinning formation film (a pinning formation film 14p). That is, the pinning formation film 14p may be provided between the pinning layer 12p and the insulating film 15.

The pinning formation film 14p includes, for example, an insulating film having a predetermined fixed charge. When the pinning layer 12p is an n-type layer, for example, an insulating film having a positive fixed charge can be used in the pinning formation film 14p. Examples of the pinning formation film 14p include a silicon nitride film and a lanthanoid-based oxide film. The lanthanoid-based oxide film is, for example, a lanthanoid (La) oxide film, a yttrium (Y) oxide film, or the like. The pinning formation film 14p may be provided between the photoelectric conversion layer 12 and the passivation film 14 (FIG. 23), or may be provided between the passivation film 14 and the insulating film 15 (FIG. 24).

A method of manufacturing the light-receiving element 1E described above is described with FIG. 25.

Processes up to a process of removing the oxide film 51 (see FIG. 20D) are performed in the same manner as described in the above third embodiment. Thereafter, the pinning formation film 14p is so formed as to cover the side face of the photoelectric conversion layer 12 and the side face and surface of the contact layer 61 (FIG. 25). Accordingly, the pinning layer 12p is formed on the side face of the photoelectric conversion layer 12 and the side face of the contact layer 61.

After the pinning layer 12p having been formed, the passivation film 14, the insulating film 15, the protective film 16, the electrode 13, and the on-chip lens 17 are formed in the same manner as described in the above first embodiment, thereby the light-receiving element 1E is completed. After the oxide film 51 having been removed, the passivation film 14 and the pinning formation film 14p may be formed in this order.

The pinning layer 12p may be formed by using the pinning formation film 14p, as in this modification example. Also in this case, it is possible to obtain similar effects to the above-described third embodiment.

Modification Example 4

FIG. 26 represents a cross-sectional configuration of a light-receiving element (a light-receiving element 1F) according to a modification example (modification example 4) of the above-described third embodiment. In the above-described third embodiment, there is described an example of a configuration in which the insulating film 15 is provided to surround each of the plurality of photoelectric conversion layers 12, and the side face 12b (the pinning layer 12p) of each photoelectric conversion layer 12 is covered with the passivation film 14; however, a gap between the photoelectric conversion layers 12 may be filled with the predetermined insulating film 18 as described in above modification example 2.

Also in such a case, it is possible to obtain similar effects to the above-described third embodiment.

Application Example 1

FIG. 27 represents a functional configuration of an imaging device 2 using an element structure of the light-receiving element 1 (or the light-receiving elements 1A to 1F, which are hereinafter collectively referred to as the light-receiving element 1) described in the above first embodiment, etc. The imaging device 2 is, for example, an infrared image sensor, and includes, for example, a pixel unit 10, which includes the light-receiving element 1, and the circuit unit 20 that drives the pixel unit 10. The circuit unit 20 includes, for example, a row scanning unit 131, a horizontal selecting unit 133, a column scanning unit 134, and a system control unit 132.

The pixel unit 10 includes, for example, a plurality of pixels P disposed in a two-dimensional matrix (the light-receiving element 1). The pixels P are each wired, for example, with a pixel drive line Lread (for example, a row selection line and a reset control line) for each pixel row, and wired with a vertical signal line Lsig for each pixel column. The pixel drive line Lread is used to transmit a drive signal for readout of a signal from a pixel P. One end of the pixel drive line Lread is coupled to an output terminal of the row scanning unit 131 that corresponds to a row.

The row scanning unit 131 includes a shift register, an address decoder, etc., and is a pixel driving unit that drives each pixel P of the pixel unit 10, for example, row by row. A signal output from each pixel P of a pixel row selected and scanned by the row scanning unit 131 is supplied to the horizontal selecting unit 133 through a corresponding vertical signal line Lsig. The horizontal selecting unit 133 includes an amplifier, a horizontal selection switch, etc. that are provided for each vertical signal line Lsig.

The column scanning unit 134 includes a shift register, an address decoder, etc., and sequentially drives the horizontal selection switches of the horizontal selecting unit 133 while scanning. Through this selective scanning by the column scanning unit 134, signals of the pixels transmitted through the respective vertical signal lines Lsig are sequentially output to respective horizontal signal lines 135, and are input to a signal processing unit (not illustrated) or the like through the horizontal signal lines 135.

In this imaging device 2, for example, a substrate 2A including the pixel unit 10 and a substrate 2B including the circuit unit 20 are stacked as illustrated in FIG. 28. However, it is not limited to this configuration; the circuit unit 20 may be formed on the same substrate as the pixel unit 10, or may be provided in an external control IC. Alternatively, the circuit unit 20 may be formed on another substrate connected by a cable or the like.

The system control unit 132 receives a clock provided from the outside, data that specifies an operation mode, etc., and outputs data such as internal information of the imaging device 2. Furthermore, the system control unit 132 includes a timing generator that generates various timing signals, and performs control of driving the row scanning unit 131, the horizontal selecting unit 133, the column scanning unit 134, etc. on the basis of various timing signals generated by the timing generator.

Application Example 2

The above-described imaging device 2 can be applied to various types of electronic apparatuses, such as a camera that can image an infrared region. FIG. 29 illustrates a schematic configuration of an electronic apparatus 3 (a camera) as an example. This electronic apparatus 3 is, for example, a camera that can take a still image or a moving image, and includes the imaging device 2, an optical system (an optical lens) 310, a shutter unit 311, a drive unit 313 that drives the imaging device 2 and the shutter unit 311, and a signal processing unit 312.

The optical system 310 guides an image light (an incident light) from a subject to the imaging device 2. This optical system 310 may include multiple optical lenses. The shutter unit 311 controls a period of light irradiation and a period of light shielding with respect to the imaging device 2. The drive unit 313 controls a transfer operation of the imaging device 2 and a shutter operation of the shutter unit 311. The signal processing unit 312 performs various signal processing on a signal output from the imaging device 2. An image signal Dout after signal processing is stored in a storage medium, such as a memory, or is output to a monitor or the like.

Furthermore, the light-receiving element 1 described in the embodiments, etc. can also be applied to electronic apparatuses (a capsule endoscope and a moving body such as a vehicle) described below.

Example of Practical Application 1 (Endoscopic Surgery System)

The technology according to the disclosure is applicable to various products. For example, the technology according to the disclosure may be applied to an endoscopic surgery system.

FIG. 30 is a view depicting an example of a schematic configuration of an endoscopic surgery system to which the technology according to an embodiment of the present disclosure (present technology) can be applied.

In FIG. 30, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 31 is a block diagram depicting an example of a functional configuration of the camera head 11102 and the CCU 11201 depicted in FIG. 30.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

As described, description is given of an example of the endoscopic surgery system to which the technology according to the disclosure may be applied. The technology according to the disclosure may be applied to the image pickup unit 11402 among the configurations described above. The application of the technology according to the disclosure to the image pickup unit 11402 makes it possible to obtain a clearer image of a surgical region, which makes it possible for a surgeon to confirm the surgical region reliably.

It is to be noted that, although the endoscopic surgery system is described here as an example, the technology according to the disclosure may be applied to, for example, a microscopic surgery system or other surgery systems other than the endoscopic surgery system.

Example of Practical Application 2 (Moving Body)

The technology according to the disclosure is applicable to various products. For example, the technology according to the disclosure may be realized as an apparatus mounted to any kind of moving bodies such as a vehicle, an electric vehicle, a hybrid electric vehicle, a motorcycle, a bicycle, a persona mobility, an aircraft, a drone, a watercraft, and a robot.

FIG. 32 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 32, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 32, an audio speaker 12061, a display section 12062, and an instrument panel 12063 are illustrated as the output device. The display section 12062 may, for example, include at least one of an on-board display and a head-up display.

FIG. 33 is a diagram depicting an example of the installation position of the imaging section 12031.

In FIG. 33, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 33 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As described, description is given of an example of the vehicle control system to which the technology according to the disclosure may be applied. The technology according to the disclosure may be applied to the imaging section 12031 among the configurations described above. The application of the technology according to the disclosure to the imaging section 12031 makes it possible to obtain an easily-visible photographed image, which makes it possible to reduce driver's fatigue.

The embodiments and application examples are described above; however, contents of the disclosure are not limited to the above-described embodiments, etc., and it is possible to make various modifications. For example, the layer configuration of the light-receiving element described in any of the above embodiments is just an example, and the light-receiving element may further include another layer. Furthermore, the material and thickness of each layer are also just examples, and are not limited to those described above.

For example, in the above-described third embodiment, etc. (FIG. 18, etc.), there is described the case where the contact layer is provided; however, instead of providing the contact layer, a pinning layer may be provided. Furthermore, in FIG. 19, there is illustrated the case where the entire side face of the photoelectric conversion layer is covered with the pinning layer; however, the pinning layer may cover a portion of the side face of the photoelectric conversion layer.

Moreover, the effects described in above embodiments, etc. are just examples; they may be other effects, or may further include another effect.

It is to be noted that the disclosure may have the following configurations.

(1)

A light-receiving element, including:

a plurality of photoelectric conversion layers each of which includes a compound semiconductor, and absorbs a wavelength in an infrared region to generate an electric charge; and an insulating film that is provided to surround each of the plurality of photoelectric conversion layers.

(2)

The light-receiving element according to (1), further including a passivation film that is provided to cover a corresponding one of side faces of the photoelectric conversion layers.

(3)

The light-receiving element according to (2), in which the insulating film is provided to fill a gap between the photoelectric conversion layers each covered with the passivation film.

(4)

The light-receiving element according to (2) or (3), further including an electrode electrically coupled to a corresponding one of the photoelectric conversion layers, in which the plurality of photoelectric conversion layers are each provided on one face of a substrate, and the passivation film is provided to cover, of a surface of the corresponding photoelectric conversion layer, a portion excluding a portion coupled to the electrode and a portion facing the substrate.

(5)

The light-receiving element according to (2) or (3), further including an electrode electrically coupled to a corresponding one of the photoelectric conversion layers, in which the passivation film is provided to cover, of a surface of the corresponding photoelectric conversion layer, a portion excluding a portion coupled to the electrode.

(6)

The light-receiving element according to any one of (2) to (5), in which the passivation film includes an insulator or a semiconductor.

(7)

The light-receiving element according to (6), in which the semiconductor is a material having a wider band gap than these of the photoelectric conversion layers.

(8)

The light-receiving element according to (1), in which the insulating film is provided to fill a gap between the plurality of photoelectric conversion layers.

(9)

The light-receiving element according to any one of (1) to (8), in which the insulating film includes silicon oxide.

(10)

The light-receiving element according to any one of (1) to (9), in which the plurality of photoelectric conversion layers are each provided on one face of a substrate, and the light-receiving element further includes:

a first electrode electrically coupled to a corresponding one of the photoelectric conversion layers; and a second electrode electrically coupled to the substrate.

(11)

The light-receiving element according to any one of (1) to (3), further including:

an electrode that is electrically coupled to a corresponding one of the photoelectric conversion layers and with which a first electric charge as a signal charge is read from a corresponding one of the photoelectric conversion layers; and a pinning layer that is provided between the photoelectric conversion layers and the insulating film and that has a second electric charge as a carrier.

(12)

The light-receiving element according to (11), in which the pinning layers are provided on a corresponding one of peripheries of the photoelectric conversion layers.

(13)

A manufacturing method of a light-receiving element, including:

forming a plurality of photoelectric conversion layers each of which includes a compound semiconductor, and absorbs a wavelength in an infrared region to generate an electric charge; and forming an insulating film that surrounds each of the plurality of photoelectric conversion layers.

(14)

The manufacturing method of the light-receiving element according to (13), further including forming a passivation film that covers a corresponding one of side faces of the photoelectric conversion layers, in which the insulating film is formed to fill a gap between the photoelectric conversion layers each covered with the passivation film.

(15)

The manufacturing method of the light-receiving element according to (14), further including forming an electrode electrically coupled to a corresponding one of the photoelectric conversion layers, in which the plurality of photoelectric conversion layers are formed on a first substrate, the passivation film is formed to cover a corresponding one of the photoelectric conversion layers, and the insulating film is formed, following which a first opening is formed on a portion of the passivation film to form the electrode in the first opening.

(16)

The manufacturing method of the light-receiving element according to (15), in which the first substrate includes InP, and the forming the plurality of photoelectric conversion layers includes:

forming an oxide film having a plurality of second openings on the first substrate; and forming InGaAs as a corresponding one of the photoelectric conversion layers in each of the plurality of second openings by selective growth and then removing the oxide film.

(17)

The manufacturing method of the light-receiving element according to (14), further including forming an electrode electrically coupled to a corresponding one of the photoelectric conversion layers, in which the plurality of photoelectric conversion layers are formed on a second substrate, a first passivation film is formed on a corresponding one of the photoelectric conversion layers, following which a third opening is formed on a portion of the first passivation film to form the electrode in the third opening, a side of the electrode is attached to a third substrate, following which the second substrate is removed, and a second passivation film as the passivation film is formed to cover a corresponding one of the photoelectric conversion layers, following which the insulating film is formed.

(18)

The manufacturing method of the light-receiving element according to (17), in which the second substrate includes silicon (Si), and the forming the plurality of photoelectric conversion layers on the second substrate includes:

forming an oxide film having a plurality of fourth openings on the second substrate;

forming a first layer including InP and a second layer including InGaAs as a corresponding one of the photoelectric conversion layers in this order in each of the plurality of fourth openings by selective growth; and removing the second substrate, and then removing the first layer and the oxide film.

(19)

An imaging device, including:

a plurality of photoelectric conversion layers each of which includes a compound semiconductor, and absorbs a wavelength in an infrared region to generate an electric charge; and an insulating film that is provided to surround each of the plurality of photoelectric conversion layers.

(20)

An electronic apparatus with an imaging device, the imaging device including:

a plurality of photoelectric conversion layers each of which includes a compound semiconductor, and absorbs a wavelength in an infrared region to generate an electric charge; and an insulating film that is provided to surround each of the plurality of photoelectric conversion layers.

This application claims for right of priority based on Japanese Priority Patent Application JP2016-4158 filed with the Japan Patent Office on Jan. 13, 2016 and Japanese Priority Patent Application JP2016-220779 filed with the Japan Patent Office on Nov. 11, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-receiving element, comprising:
a substrate;
a plurality of photoelectric conversion layers, wherein:
   each of the plurality of photoelectric conversion layers:
      includes a compound semiconductor, and
      absorbs a wavelength in an infrared region for generation of an electric charge, and
   each of the plurality of photoelectric conversion layers is on a face of the substrate; and
an insulating film that surrounds each of the plurality of photoelectric conversion layers;
a first electrode that is electrically coupled to a corresponding photoelectric conversion layer of the plurality of photoelectric conversion layers; and
a second electrode that is electrically coupled to the substrate, wherein the substrate is between the plurality of photoelectric conversion layers and the second electrode.

2. The light-receiving element according to claim 1, further comprising a passivation film that covers side faces of the corresponding photoelectric conversion layer of the plurality of photoelectric conversion layers.

3. The light-receiving element according to claim 2, wherein:
the insulating film fills a gap between each pair of adjacent photoelectric conversion layers of the plurality of photoelectric conversion layers, and
each of the plurality of photoelectric conversion layers is covered with the passivation film.

4. The light-receiving element according to claim 2, wherein
the passivation film covers a surface of the corresponding photoelectric conversion layer, except for a first portion of the corresponding photoelectric conversion layer and a second portion of the corresponding photoelectric conversion layer,
the first portion of the corresponding photoelectric conversion layer is coupled to the first electrode, and
a second portion of the corresponding photoelectric conversion layer faces the substrate.

5. The light-receiving element according to claim 2, wherein:
the passivation film covers a surface of the corresponding photoelectric conversion layer, except for a portion of the corresponding photoelectric conversion layer, and
the portion coupled to the first electrode.

6. The light-receiving element according to claim 2, wherein the passivation film includes one of an insulator or a semiconductor.

7. The light-receiving element according to claim 6, wherein a band gap of the semiconductor is wider than a band gap of the plurality of photoelectric conversion layers.

8. The light-receiving element according to claim 1, wherein the insulating film fills a gap between each pair of adjacent photoelectric conversion layers of the plurality of photoelectric conversion layers.

9. The light-receiving element according to claim 1, wherein the insulating film includes silicon oxide.

10. The light-receiving element according to claim 1, wherein:
the first electrode is electrically coupled to the corresponding photoelectric conversion layer of the plurality of photoelectric conversion layers,
the first electrode reads a first electric charge as a signal charge from the corresponding photoelectric conversion layer, and
the light-receiving element further comprises a pinning layer between the plurality of photoelectric conversion layers and the insulating film, wherein the pinning layer has a second electric charge as a carrier.

11. The light-receiving element according to claim 10, wherein the pinning layer is on one of peripheries of the corresponding photoelectric conversion layer.

12. A manufacturing method of a light-receiving element, comprising:
forming a first substrate;
forming a plurality of photoelectric conversion layers, wherein:
   each of the plurality of photoelectric conversion layers:
      includes a compound semiconductor, and
      absorbs a wavelength in an infrared region for generation of an electric charge,
   each of the plurality of photoelectric conversion layers is on a face of the first substrate; and
forming an insulating film that surrounds each of the plurality of photoelectric conversion layers;
forming a first electrode that is electrically coupled to a corresponding photoelectric conversion layer of the plurality of photoelectric conversion layers; and
forming a second electrode that is electrically coupled to the first substrate, wherein the first substrate is between the plurality of photoelectric conversion layers and the second electrode.

13. The manufacturing method of the light-receiving element according to claim 12, further comprising forming a passivation film that covers side faces of the corresponding photoelectric conversion layer of the plurality of photoelectric conversion layers, wherein:
the insulating film is formed to fill a gap between each pair of adjacent photoelectric conversion layers of the plurality of photoelectric conversion layers, and
each of the plurality of photoelectric conversion layers is covered with the passivation film.

14. The manufacturing method of the light-receiving element according to claim 13,
wherein
the passivation film is formed to cover the corresponding photoelectric conversion layer of the plurality of photoelectric conversion layers, and
the insulating film is formed, following which a first opening is formed on a portion of the passivation film to form the first electrode in the first opening.

15. The manufacturing method of the light-receiving element according to claim 14, wherein
the first substrate includes InP, and
the forming of the plurality of photoelectric conversion layers includes:
   forming an oxide film having a plurality of second openings on the first substrate; and
   forming InGaAs as the corresponding photoelectric conversion layer in each of the plurality of second openings based on selective growth and then removing the oxide film.

16. The manufacturing method of the light-receiving element according to claim 13, further comprising:
forming the first electrode electrically coupled to the corresponding photoelectric conversion layer, wherein the plurality of photoelectric conversion layers are formed on a second substrate, forming a first passivation film on the corresponding photoelectric conversion layer, following which
a third opening is formed on a portion of the first passivation film to form the first electrode in the third opening,
a side of the first electrode is attached to a third substrate, following which the second substrate is removed, and
a second passivation film as the passivation film is formed to cover the corresponding photoelectric conversion layer, following which the insulating film is formed.

17. The manufacturing method of the light-receiving element according to claim 16, wherein
the second substrate includes silicon (Si), and
the forming of the plurality of photoelectric conversion layers on the second substrate includes:
forming an oxide film having a plurality of fourth openings on the second substrate;
forming a first layer including InP and a second layer including InGaAs as the corresponding photoelectric conversion layer in an order in each of the plurality of fourth openings by selective growth; and
removing the second substrate, and then removing the first layer and the oxide film.

18. An imaging device, comprising:
a substrate;
a plurality of photoelectric conversion layers, wherein:
each of the plurality of photoelectric conversion layers:
includes a compound semiconductor, and
absorbs a wavelength in an infrared region for generation of an electric charge, and
each of the plurality of photoelectric conversion layers is on a face of the substrate; and
an insulating film that surrounds each of the plurality of photoelectric conversion layers;
a first electrode that is electrically coupled to a corresponding photoelectric conversion layer of the plurality of photoelectric conversion layers; and
a second electrode that is electrically coupled to the substrate, wherein the substrate is between the plurality of photoelectric conversion layers and the second electrode.

19. An electronic apparatus with an imaging device, the imaging device comprising:
a substrate;
a plurality of photoelectric conversion layers, wherein:
each of the plurality of photoelectric conversion layers:
includes a compound semiconductor, and
absorbs a wavelength in an infrared region for generation of an electric charge; and
an insulating film that surrounds each of the plurality of photoelectric conversion layers;
a first electrode that is electrically coupled to a corresponding photoelectric conversion layer of the plurality of photoelectric conversion layers; and
a second electrode that is electrically coupled to the substrate, wherein the substrate is between the plurality of photoelectric conversion layers and the second electrode.

* * * * *